(12) United States Patent
Han et al.

(10) Patent No.: US 10,915,023 B2
(45) Date of Patent: Feb. 9, 2021

(54) NITROGEN HETEROCYCLE-CONTAINING MONOLAYERS ON METAL OXIDES FOR BINDING BIOPOLYMERS

(71) Applicant: International Business Machines Corporation, Armonk, NY (US)

(72) Inventors: Shu-Jen Han, Cortlandt Manor, NY (US); Brian Lin, Fremont, CA (US); Hareem T. Maune, Irvine, CA (US); Charles T. Rettner, San Jose, CA (US); Linda K. Sundberg, Los Gatos, CA (US); Leslie E. Thompson, San Jose, CA (US); Hoa D. Truong, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 15/802,584

(22) Filed: Nov. 3, 2017

(65) Prior Publication Data
US 2019/0137879 A1    May 9, 2019

(51) Int. Cl.
*H01L 51/00* (2006.01)
*G03F 7/11* (2006.01)
(Continued)

(52) U.S. Cl.
CPC .............. *G03F 7/11* (2013.01); *G03F 7/0002* (2013.01); *G03F 7/039* (2013.01); *G03F 7/165* (2013.01); *G03F 7/20* (2013.01); *H01L 51/0075* (2013.01); *H01L 51/0093* (2013.01); *H01L 51/0558* (2013.01); *H01L 51/0003* (2013.01); *H01L 51/0014* (2013.01); *H01L 51/0048* (2013.01);
(Continued)

(58) Field of Classification Search
None
See application file for complete search history.

(56) References Cited

U.S. PATENT DOCUMENTS 5,324,591 A * 6/1994 Georger, Jr. ........... B05D 1/185
                                              257/E21.174
5,527,711 A   6/1996 Moy et al.
(Continued)

OTHER PUBLICATIONS

Barish, et al., "An information-bearing seed for nucleating algorithmic self-assembly", PNAS, 2009, vol. 106, pp. 6054-6059.
(Continued)

*Primary Examiner* — Robert T. Crow
(74) *Attorney, Agent, or Firm* — Michael R. Roberts

(57) ABSTRACT

A crosslinked self-assembled monolayer (SAM), comprising surface groups containing a nitrogen-heterocycle, was formed on an oxygen plasma-treated silicon oxide or hafnium oxide top surface of a substrate. The SAM is covalently bound to the underlying oxide layer. The SAM was patterned by direct write methods using ultraviolet (UV) light of wavelength 193 nm or an electron beam, forming a line-space pattern comprising non-exposed SAM features. The non-exposed SAM features non-covalently bound DNA-wrapped carbon nanotubes (DNA-CNT) deposited from aqueous solution with a selective placement efficiency of about 90%. Good alignment of carbon nanotubes to the long axis of the SAM features was also observed. The resulting patterned biopolymer features were used to prepare a CNT based field effect transistor.

18 Claims, 30 Drawing Sheets
Specification includes a Sequence Listing.

(51) Int. Cl.
  *G03F 7/16*  (2006.01)
  *G03F 7/20*  (2006.01)
  *H01L 51/05*  (2006.01)
  *G03F 7/00*  (2006.01)
  *G03F 7/039* (2006.01)

(52) U.S. Cl.
  CPC ...... *H01L 51/0525* (2013.01); *H01L 51/0545* (2013.01)

(56) References Cited

U.S. PATENT DOCUMENTS

| | | | |
|---|---|---|---|
| 5,627,244 | A | 5/1997 | Sato |
| 6,528,264 | B1* | 3/2003 | Pal .................. B82Y 30/00 506/32 |
| 6,780,582 | B1 | 8/2004 | Wagner et al. |
| 7,247,469 | B2 | 7/2007 | Wagner et al. |
| 7,517,496 | B2 | 4/2009 | Pohl |
| 7,625,702 | B2 | 12/2009 | Cha |
| 7,666,661 | B2 | 2/2010 | Abbott et al. |
| 8,323,888 | B2 | 12/2012 | Mirkin et al. |
| 8,999,452 | B2 | 4/2015 | Messersmith et al. |
| 2002/0028457 | A1 | 3/2002 | Empedocles et al. |
| 2002/0065242 | A1* | 5/2002 | Ford .................. H01B 1/12 514/44 R |
| 2005/0118731 | A1* | 6/2005 | Salafsky .............. B82Y 30/00 436/518 |
| 2005/0233473 | A1 | 10/2005 | Cicero et al. |
| 2006/0054506 | A1* | 3/2006 | Natan ................. B22F 1/0025 205/112 |
| 2006/0275371 | A1* | 12/2006 | Dai .................... B82Y 5/00 424/489 |
| 2007/0082019 | A1 | 4/2007 | Huang et al. |
| 2008/0214410 | A1 | 9/2008 | Yan et al. |
| 2010/0069621 | A1* | 3/2010 | Maune ............... B82B 1/00 536/23.1 |
| 2010/0170800 | A1 | 7/2010 | Son et al. |
| 2010/0173142 | A1 | 7/2010 | Cha |
| 2011/0159481 | A1* | 6/2011 | Liu .................... C12Q 1/48 435/6.11 |
| 2012/0296189 | A1 | 11/2012 | Bhogal et al. |
| 2015/0184237 | A1* | 7/2015 | Su .................... G01N 27/00 435/6.1 |

OTHER PUBLICATIONS

Berger, "DNA wrappers for carbon nanotubes", Nanowerk Spotlight, article posted Jun. 4, 2007 at www.nanowerk.com; downloaded Feb. 25, 2017 from the internet at http://www.nanowerk.com/spotlight/spoticN2019.php.

Dorvel et al., "Vapor-Phase Deposition of Monofunctional Alkoxysilanes for Sub-Nanometer-Level Biointerfacing on Silicon Oxide Surfaces", Adv. Funct. Mater. 2010, 20, 87-95.
Gopinth et al., "Optimized Assembly and Covalent Coupling of Single-Molecule DNA Origami Nanoarrays", ACSNano, 2014, vol. 8, 12030-12040.
Guet al., "DNA nanowire fabrication", Nanotechnology, 2005, 17, 1, R14.
Han et al., "DNA-Linker-Induced Surface Assembly of Ultra Dense Parallel Single Walled Carbon Nanotube Arrays", Nano Lett. 2012; 12, 1129-1135.
Hankins et al., "Vapor Deposition of Amino-Functionalized Self-Assembled Monolayers on MEMS", Proceedings of SPIE vol. 2003, v 4980, p. 238-247.
Hook et al., "Evaluation of Oxygen Plasma and UV Ozone Methods for Cleaning of Occluded Areas in MEMS Devices", Journal of Microelectromechanical Systems, vol. 19, No. 6, Dec. 2010, p. 1292-1298.
Hung et al., "Large-area spatially ordered arrays of gold nanoparticles directed by lithographically confined DNA origami", Nature Nanotechnology, vol. 5, Feb. 2010, p. 121-126.
Ke et al., "DNA Brick Crystals with Prescribed Depth", Nature Chemistry, 2014, 6(11), 994-1002.
Kershner et al., "Placement and orientation of individual DNA shapes on lithographically patterned surfaces", Nature Nanotechnology, vol. 4, Sep. 2009, p. 557-561.
Love et al., "Self-Assembled Monolayers of Thiolates on Metals as a Form of Nanotechnology", Chem. Rev. 2005, 105, 1103-1169.
Maeda et al., "Genetically engineered protein nanowires: unique features in site-specific functionalization and multi-dimensional self-assembly", Soft Matter, 2012, 8, 7533-7544, abstract.
Maune et al., "DNA-Directed Self-Assembly of Highly Ordered and Dense Single-Walled Carbon Nanotube Arrays", 3D DNA Nanostructure, Methods in Molecular Biology, Humana Press, copyright 2017, Springer Science and Business Media New York, edited by Y. Ke and P. Wang, Chapter 17, p. 245-256.
Maune et al., "Self-assembly of carbon nanotubes into two-dimensional geometries using DNA origami templates", Nature Nanotechnology, vol. 5, Jan. 2010, p. 61-66.
Park et al., "High-density integration of carbon nanotubes via chemical self-assembly", Nature Nanotechnology | vol. 7 | Dec. 2012 | p. 787-789.
Singh et al., "Sequence-Selective Detection of Double-Stranded DNA Sequences Using Pyrrole-Imidazole Polyamide Microarrays", J. Am. Chem. Soc. 2013, 135, 3449-3457.
Tanenbaum et al., "High resolution electron beam lithography using ZEP-520 and KRS resists at low voltage", Journal of Vacuum Science & Technology B, Nanotechnology and Microelectronics: Materials, Processing, Measurement, and Phenomena 14, 3829 (1996), Abstract.
Turkcan et al., "Silanized polymeric nanoparticles for DNA isolation", Materials Science and Engineering C 33 (2013) 4498-4503.

* cited by examiner

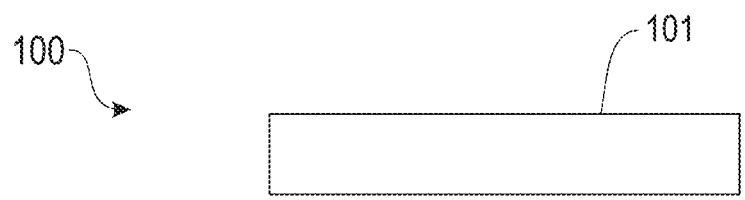
FIG. 1A
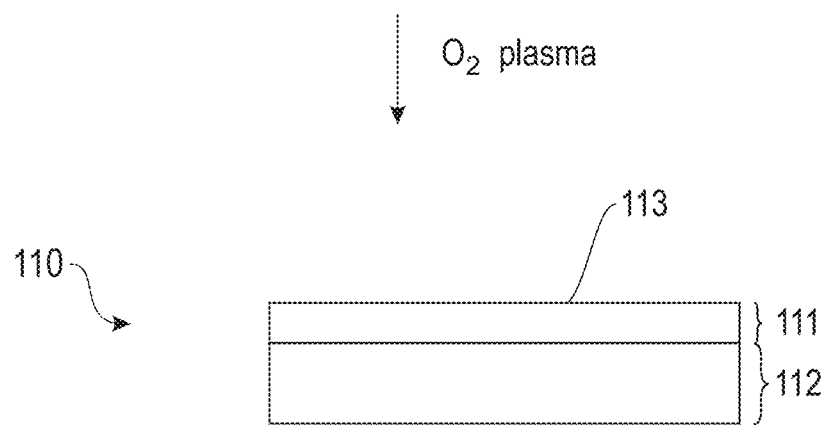
FIG. 1B
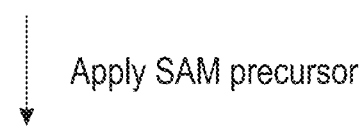

Pattern-wise UV expose

Apply Biomolecule

1. Apply resist
2. Expose
3. Develop

1. Etch
2. Strip resist

Apply biopolymer

1. Apply Resist
2. Expose
3. Develop

1. Optional etch
2. Apply SAM precursor

Strip resist

Apply biopolymer

Apply SAM Precursor
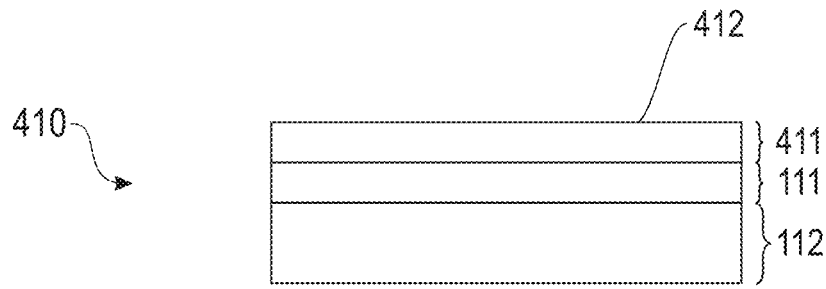
Apply biopolymer

1. Apply resist
2. Expose
3. Develop

1. Etch
2. Optional strip

1. Apply resist
2. Expose
3. Develop

Apply biopolymer

Strip resist

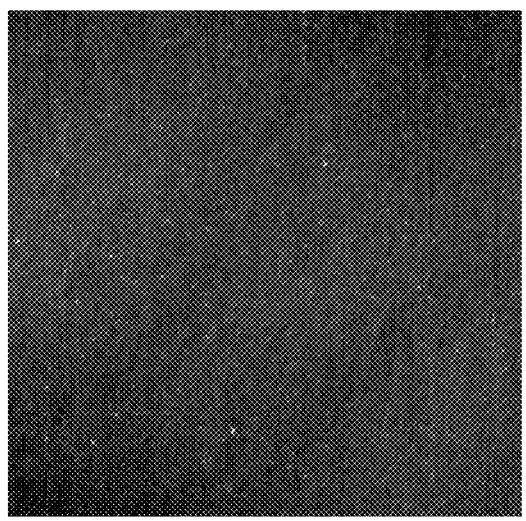
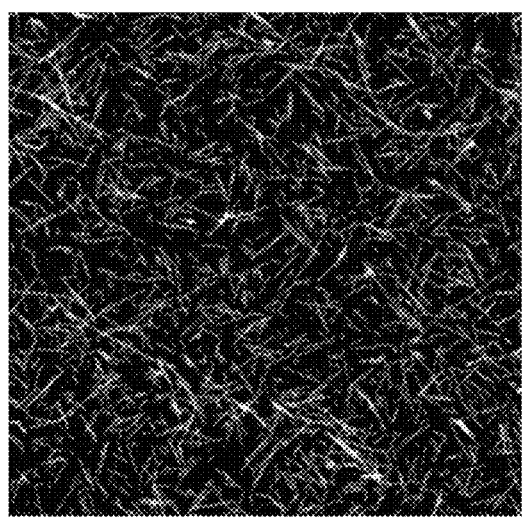
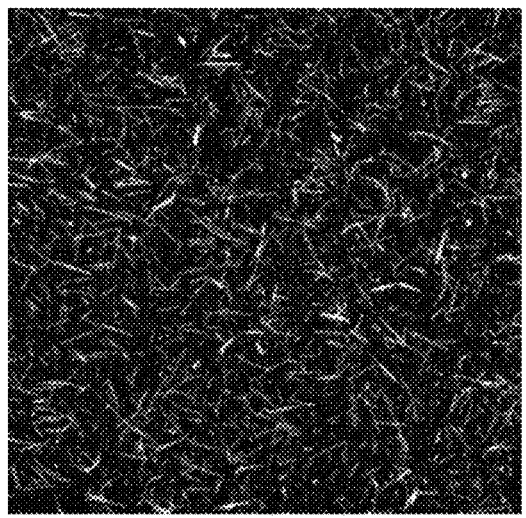
FIG. 11C
FIG. 11B
FIG. 11A

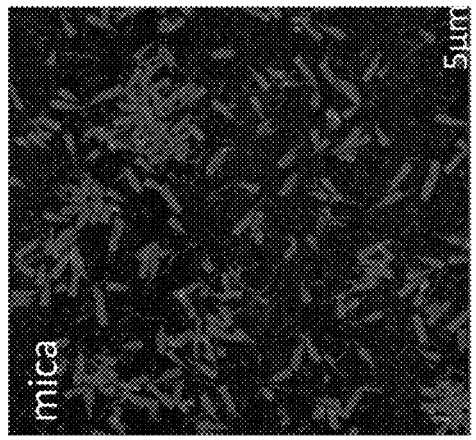
FIG. 13A (comp.)
FIG. 13B
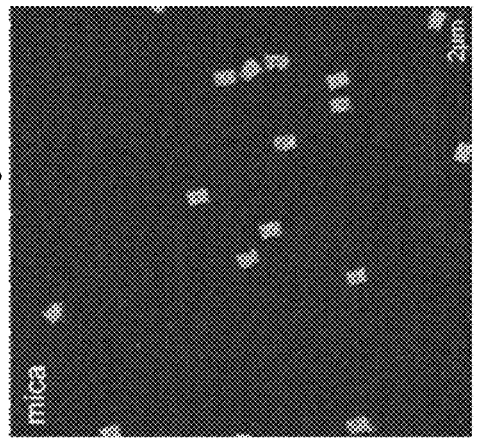
FIG. 12A (comp.)
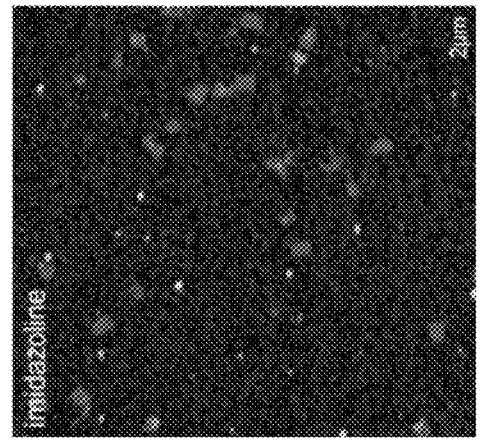
FIG. 12B 1420 mJ/cm²

4260 mJ/cm²

7100 mJ/cm²

DNA-CNT on unmodified HfO2

DNA-CNT on DHIPS HfO2

NITROGEN HETEROCYCLE-CONTAINING MONOLAYERS ON METAL OXIDES FOR BINDING BIOPOLYMERS

BACKGROUND

The present invention relates to methods of forming nitrogen heterocycle-containing monolayers on metal oxides for binding biopolymers, and more specifically to methods of forming a patterned layer containing a biopolymer disposed on an N-heterocycle-containing monolayer for electronic applications.

Biopolymers are attractive as constituents for advanced solid-state device applications due to their inherent modularity, controllability, and breadth of functions. Commonly employed in biomedical and molecular sensing applications, biopolymers are pioneering their way into nanoscale bottom-up fabrication processes where state-of-the-art top-down approaches have become prohibitive. Efforts have been directed towards the development of nanowires, lithographic masks, and scaffolds, which incorporate nucleic acids and proteins, for the fabrication of next-generation bioelectronics.

DNA has been used to control the assembly of carbon nanotubes (CNTs) in the construction of field effect transistor (FET) devices, and DNA origami has been used in lithographic masks. DNA origami refers to a long strand of DNA having a particular three-dimensional folded structure stabilized by smaller DNA oligomers, referred to as staple strands, which are bound to selective sites of the long strand DNA. Despite much interest in bioelectronics, methods of coupling biopolymers to semiconductor relevant substrates remain limited.

Silicon is the primary substrate of interest for semiconducting applications. However, biopolymers do not adsorb strongly to silicon. To enhance the binding interaction, chemical methods are employed that exploit a native or chemically grown oxide layer on silicon. Exposing the silicon-oxide, which also binds poorly to biopolymers, to highly oxidative conditions, such as ozone or piranha solution (i.e., solution of sulfuric acid and hydrogen peroxide) can generate reactive silanol groups. Although the silanol-containing surfaces are capable of associating with biopolymers, the preparative conditions can be hazardous, and the silanol groups created by these methods are unstable under ambient conditions.

In the case of DNA origami, excessively high concentrations of salts are required for adsorption of the biopolymer to the oxide surface. The salt concentration corresponds to 5-10 times the ionic strength required for DNA folding and binding to mica. This magnitude of salt can be detrimental to biopolymer folding and problematic to electronics development. To circumvent such issues, silanol surfaces are often modified through chemisorption and physiosorption to produce a compatibilization layer.

Alkyl, primary amine, sulfur, carboxylic acids, and hydroxyl chemical functionalities have been used to enhance compatibility. Alkyl functionalized surfaces are effective at adsorbing proteins through hydrophobic interactions, a mechanism that can unfold proteins irreversibly. This strategy is inappropriate for applications where proteins need to remain folded. Primary amine, sulfur, carboxylate, and hydroxl moieties can interact with biopolymers through electrostatic interactions or be further modified for covalent conjugation. Akin to alkyl functionality, these moieties are effective for the attachment of biopolymers. Nonetheless, drawbacks persist. For example, primary amine functionalized silicon oxide surfaces can self-degrade under long aqueous exposure, mild pH, and elevated temperature conditions. Moreover, covalent conjugations often require protein modifications and subsequent chemical treatments that can be complex.

Less hazardous and more efficient methods are needed for binding DNA and DNA-carbon nanotubes (DNA-CNTs) to oxide surfaces. The methods should yield layered structures having well-defined biopolymer patterns that are stable over a wide range of pH conditions and are compatible with semiconductor manufacturing processes.

SUMMARY

Accordingly, a method is disclosed, comprising:

providing a substrate comprising an oxygen plasma treated top surface, the oxygen plasma treated top surface comprising an oxide of silicon(IV) and/or hafnium(IV);

disposing a compound comprising a nitrogen heterocycle onto the plasma treated top surface, thereby forming a crosslinked self-assembled monolayer (SAM) covalently linked to the oxygen plasma treated top surface, the SAM having a thickness of about one molecule of the compound, the SAM having a top surface comprising the nitrogen heterocycle;

exposing the SAM pattern-wise to ultraviolet light and/or an electron beam, thereby forming a patterned SAM disposed on the substrate, the patterned SAM comprising chemically distinct exposed regions and non-exposed regions; and disposing an aqueous mixture onto the patterned SAM, the aqueous mixture comprising a biopolymer, a metal cation, and optionally a carbon nanotube, thereby forming a layered structure comprising a patterned biopolymer layer, the patterned biopolymer layer comprising biopolymer features separated by recessed regions, the biopolymer features substantially confined to, and non-covalently bound to, respective top surfaces of non-exposed regions of the patterned SAM;

wherein the biopolymer features comprise the biopolymer, the metal cation, and optionally the carbon nanotube, and the exposed regions of the patterned SAM have none of, or substantially none of, the biopolymer and the carbon nanotube of the aqueous mixture disposed thereon.

Further disclosed is a method comprising:

providing a substrate comprising an oxygen plasma treated top surface, the oxygen plasma treated top surface comprising an oxide of silicon(IV) and/or hafnium(IV);

disposing a compound comprising a nitrogen heterocycle onto the plasma treated top surface, thereby forming a crosslinked self-assembled monolayer (SAM) covalently linked to the oxygen plasma treated top surface, the SAM having a thickness of about one molecule of the compound, the SAM having a top surface comprising the nitrogen heterocycle;

forming a patterned resist layer disposed on the top surface of the SAM, the patterned resist layer comprising resist features separated by recessed regions, the recessed regions of the patterned resist layer having respective bottom surfaces comprising material of the SAM;

selectively removing the SAM of the recessed regions of the patterned resist layer using a reactive ion etch, thereby forming an etched layered structure;

selectively removing any residual resist from the etched layered structure using a stripping agent, thereby forming a treated layered structure, the treated layered structure comprising a patterned SAM, the patterned SAM comprising SAM features separated by recessed regions, the recessed regions of the patterned SAM having bottom surfaces; and disposing an aqueous mixture onto the treated layered structure, the aqueous mixture comprising a biopolymer, a metal cation, and optionally a carbon nanotube, thereby forming a second layered structure comprising a patterned biopolymer layer, the patterned biopolymer layer comprising biopolymer features separated by recessed regions, the biopolymer features substantially confined to, and non-covalently bound to, respective top surfaces of the SAM features;

wherein the biopolymer features comprise the biopolymer, the metal cation, and optionally the carbon nanotube, and bottom surfaces of the recessed regions of the patterned biopolymer layer have none of, or substantially none of, the biopolymer and the carbon nanotube of the aqueous mixture disposed thereon.

Also disclosed is a method comprising:

providing a substrate comprising an oxygen plasma treated top surface, the oxygen plasma treated top surface comprising an oxide of silicon(IV) and/or hafnium(IV);

disposing a compound comprising a nitrogen heterocycle onto the plasma treated top surface, thereby forming a crosslinked self-assembled monolayer (SAM) covalently linked to the oxygen plasma treated top surface, the SAM having a thickness of about one molecule of the compound, the SAM having a top surface comprising the nitrogen heterocycle;

disposing an aqueous mixture onto the top surface of the SAM, the aqueous mixture comprising a biopolymer, a metal cation, and optionally a carbon nanotube, thereby forming a layered structure comprising a biopolymer layer disposed on and non-covalently bound to the SAM, the biopolymer layer having a top surface;

forming a patterned resist layer disposed on the top surface of the biopolymer layer, the patterned resist layer comprising resist features separated by recessed regions, the recessed regions of the patterned resist layer having bottom surfaces comprising material of the biopolymer layer;

selectively removing the biopolymer layer and/or SAM of the recessed regions of the patterned resist layer using a reactive ion etch, thereby forming an etched layered structure; and removing residual resist from the etched layered structure using a resist stripping agent, thereby forming a layered structure, the layered structure comprising a patterned biopolymer layer, the patterned biopolymer layer comprising biopolymer features separated by recessed regions, the recessed regions of the patterned biopolymer layer having bottom surfaces comprising material of the substrate and/or the SAM;

wherein the biopolymer features comprise the biopolymer, the metal cation, and optionally the carbon nanotube, the biopolymer features are non-covalently bound to the SAM, and bottom surfaces of the recessed regions of the patterned biopolymer layer have none of, or substantially none of, the biopolymer and the carbon nanotube of the aqueous mixture disposed thereon.

Also disclosed is a method comprising;

a) binding a compound comprising a nitrogen heterocycle to an oxide substrate; and b) bringing multivalent cations and DNA into proximity with the nitrogen heterocycle, thereby forming a structure in which the cations are bound to both the DNA and the nitrogen heterocycle.

The previously described method can further comprise after step a):

pattern-wise degrading or removing the bound compound comprising the nitrogen heterocycle from select areas to create patterned regions comprising nitrogen heterocycle on the oxide substrate;

and wherein step b) comprises bringing multivalent cations and DNA into proximity with the areas rich in nitrogen heterocycle, thereby forming structures in which the cations are bound to both the DNA and the nitrogen heterocycle selectively on said patterned regions on the oxide substrate.

The DNA can be bound to a second material other than a DNA, a second DNA, a carbon nanotube, or a combination thereof.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 1A-1E are cross-sectional layer diagrams illustrating formation of a patterned biopolymer layer disposed on a patterned self-assembled monolayer (SAM) that has preferential affinity for adsorption of a biopolymer.

FIGS. 4A-4E are cross-sectional layer diagrams illustrating formation of a patterned biopolymer layer by a process in which a patterned resist layer is formed on a non-patterned biopolymer layer, which is disposed on a non-patterned SAM. A subsequent etch step transfers the resist pattern to the biopolymer layer and/or SAM. Residual resist remaining after the etch can be selectively removed with a resist stripping agent, leaving a patterned biopolymer layer.

FIGS. 11A-11C are atomic force microscope (AFM) micrographs showing the results of treating a DHIPS-modified $SiO_2$ surface, a mica surface (comparative), and a non-modified $SiO_2$ surface (comparative), respectively, with the DNA-CNT of Example 3.

FIGS. 12A-12B (AFM micrographs) compare binding of mica and DHIPS-modified $SiO_2$, respectively, with two-dimensional DNA origami (100 nm×100 nm) of Example 4.

FIGS. 13A-13B (AFM micrographs) compare binding of mica and DHIPS-modified $SiO_2$ surface, respectively, with two-dimensional DNA ribbons (~100 nm×1 micrometer) of Example 5.

DETAILED DESCRIPTION

Figure 1C:
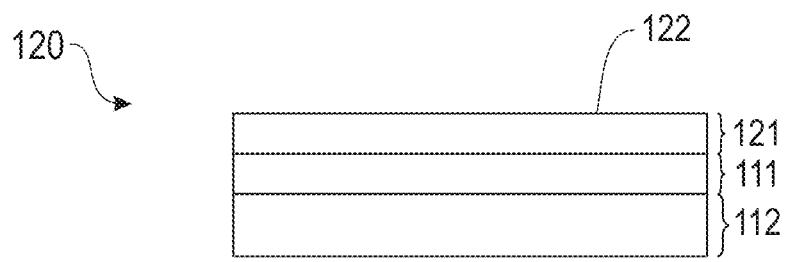

Disclosed are methods of forming a layered structure useful in biotechnology and electronics applications. The layered structure is prepared using a substrate comprising an oxygen plasma treated metal oxide layer as the top surface. A crosslinked patterned or non-patterned self-assembled monolayer (SAM) derived from a compound comprising a nitrogen heterocycle is formed on, and covalently bound to, the metal oxide layer. The nitrogen heterocycle is a covalently bound sub-structure of the compound and comprises an aliphatic or aromatic ring containing at least one nitrogen. The nitrogen heterocycle portion of the compound can have a valency of one or more. The top surface of the SAM comprises the nitrogen heterocycle portion of the bound compound. A patterned biopolymer layer is formed on, and non-covalently bound to, the SAM. The patterned biopolymer layer comprises i) a biopolymer selected from the group consisting of nucleic acids (e.g., deoxyribonucleic acids (DNAs), ribonucleic acids (RNAs), protein nucleic acids), proteins, peptides, and combinations thereof, ii) a metal cation, and optionally iii) a nanoparticle selected from the group consisting of carbon nanotube (CNT), other nanoparticles, and combinations thereof.

Preferably, the biopolymer is a DNA. The DNA can be bound (preferably non-covalently) to a second material other than DNA as described above, a second DNA, a carbon nanotube, or a combination thereof. The biopolymer and CNT can be present together as a biopolymer-CNT complex (e.g., a complex comprising one or more strands of DNA wrapped around, and in contact with, the outer surface of the carbon nanotube, referred to herein as a "DNA-CNT"). In the examples further below, a patterned biopolymer layer comprising a DNA-CNT is used to form a field effect transistor (FET).

Nanoparticles can have a 1-dimensional shape (e.g., nanowire, wherein in the diameter is between 1 nm and 100 nm or a 2-dimensional shape (e.g., tabular crystal, wherein the thickness of the crystal is between 1 nm and 100 nm), or a 3-dimensional shape (e.g., cubic, octahedral, cylindrical, or an irregular shape). Nanoparticles include i) metal-containing nanoparticles that comprise a metal having a valency of 0 or more and ii) metalloid-containing nanoparticles that comprise a metalloid having a valency of 0 or more. Examples of other nanoparticles include nanowires and quantum dots.

The metal oxide layer can comprise oxides and optional hydroxides of silicon(IV) and/or hafnium(IV). In an embodiment, the metal oxide layer comprises oxides and optional hydroxides of silicon(IV).

The SAM has a thickness of one surface group formed by the reaction of an N-heterocycle-containing compound (SAM precursor) with active hydroxy groups of the oxygen plasma treated metal oxide layer of the substrate. That is, the SAM has a thickness of about one molecule of the SAM precursor. The top surface of the SAM comprises a plurality of nitrogen heterocyclic groups having chemical affinity for the biopolymer.

A patterned SAM can be prepared using standard lithographic techniques utilizing a positive tone or negative tone resist. The patterned SAM can also be formed by pattern-wise degrading or removing the bound compound comprising the nitrogen heterocycle. As a non-limiting example, direct writing to a non-patterned SAM using ultraviolet light (UV) can ablate the SAM or chemically alter the binding properties of the SAM in the exposed areas. The patterned SAM can serve as a chemical pre-pattern for the biopolymer, selectively guiding the placement and alignment of 2-dimensional and 3-dimensional biopolymers (e.g., 2-dimensional DNA origami, 3-dimensional DNA crystals) and/or a biopolymer-CNT complexes onto the top surface of the SAM. The chemical pre-pattern guides biopolymer placement and orientation predominantly through non-covalent chemical interactions of the biopolymer with the nitrogen heterocycle surface groups of the SAM and the spatial dimensions of the SAM surfaces. That is, any sidewalls of the topography of the patterned SAM have relatively little influence on the placement and alignment of the biopolymer compared to the chemical interactions of the biopolymer with the top surface of the SAM.

The SAM comprises surface groups of formula (1):

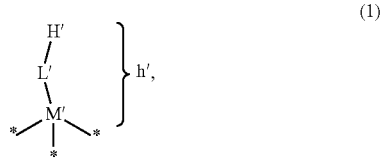

(1)

wherein
h' is the thickness of the SAM having a value of 0.1 to 15 nm,
H' is a monovalent radical comprising a nitrogen heterocycle,
L' is any suitable divalent linking group comprising 1-20 carbons,
M' is silicon(IV) or hafnium(IV), and
one or more M' groups of the SAM are covalently linked to a divalent oxygen bound to an M" group, wherein M" is a silicon(IV) group or hafnium(IV) group of the metal oxide layer of the substrate.

Herein, an atomic center bearing a bond to an asterisk means the atomic center is linked to an unspecified atomic center represented by the asterisk.

It should be understood that M" of the metal oxide layer can be bonded to 2 to 4 oxygens, as shown below.

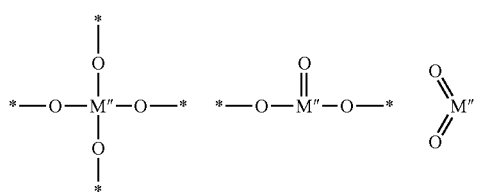

In addition to L', M' of formula (1) can be covalently linked to up to three independent functional groups selected from the group consisting of hydroxy group (*—OH), divalent oxygens linked to M' groups, divalent oxygens linked to M", and alkoxy groups (*—OR', wherein R' is a C1-C6 alkyl group) and M" is silicon(IV) or hafnium(IV) of the metal oxide layer. At least one M' of the SAM is covalently linked to a divalent oxygen that is covalently linked to an M" of the metal oxide layer.

A given M' of the SAM can be linked to up to 3 other metal(IV) centers selected from M' and M" via respective divalent oxygens, as illustrated below. It should be understood that each M' is also linked to an H'-L'-* surface group. R' is a C1-C6 alkyl group.

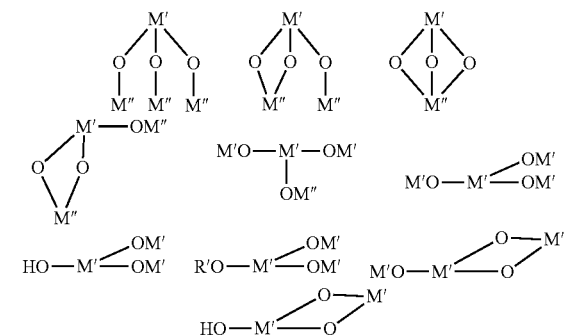

Exemplary non-limiting L' groups include C1-C20 branched and non-branched alkylene groups (e.g., methylene, ethan-1,2-diyl, propan-1,3-diyl, butan-1,4-diyl, pentan-1,5-diyl, hexan-1,6-diyl, heptan-1,7-diyl, octan-1,8-diyl, nonan-1,9-diyl, decan-1,10-diyl, undecan-1,11-diyl, dodecan-1,12-diyl, tridecan-1,13-diyl, tetradecan-1,14-diyl, pentadecan-1,15-diyl, hexadecan-1,16-diyl, heptadecan-1,17-diyl, octadecan-1,18-diyl, nonadecan-1,19-diyl, and eicosan-1,20-diyl), and substituted and non-substituted divalent aromatic groups (e.g., benzene-1,4-diyl, benzene-1,3-diyl).

H' can comprise 1-5 heterocyclic nitrogens residing in 1-5 heterocyclic rings. A given heterocyclic nitrogen can be a nitrogen in the form of a secondary amine, a protonated secondary amine, a tertiary amine, a protonated tertiary amine, an aromatic amine, a protonated aromatic amine, or a quaternary amine (positive charged nitrogen covalently bound only to carbons. H' can comprise a combination of the foregoing heterocyclic nitrogens. In an embodiment, the H' group comprises a 5-membered ring comprising 1-5 nitrogens. In another more specific embodiment, the H' group comprises a 5-membered ring comprising 2-3 nitrogens.

Exemplary non-limiting H' groups include those listed below.

H' groups

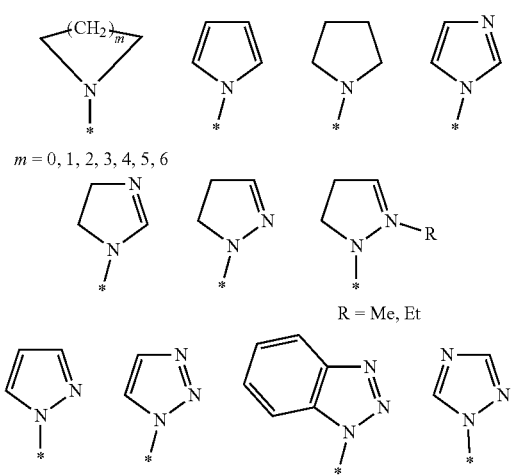

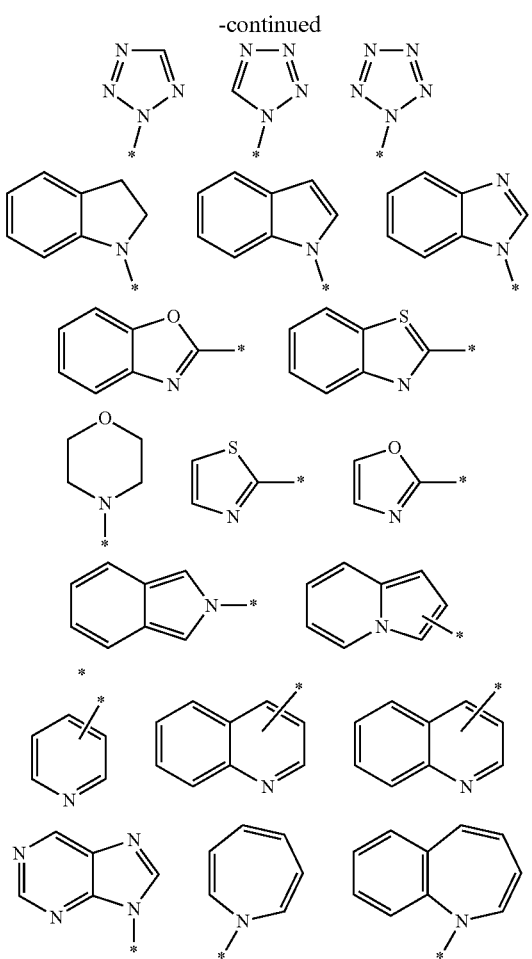

Herein, a bond overlapping a ring means the end of the bond inside the ring can be positioned at (linked to) any ring carbon that would otherwise be bonded to a hydrogen (i.e., substituting for the hydrogen). Each asterisk of the above H' groups represents an atomic center of L'.

Although the SAM can directly interact with the biomolecule, the H' group and metal cation together can enhance the non-covalent binding of the biopolymer to the top surface of the SAM, making possible the selective binding of the biopolymer to the top surfaces of the SAM features of a patterned SAM compared to other surfaces available (e.g., bottom surfaces of recessed regions separating SAM features that can comprise metal oxide, resist material, and/or other materials of the substrate).

The metal cation of the biopolymer layer is preferably non-covalently bound to the biopolymer and heterocyclic nitrogens at the interface of the biopolymer layer and the SAM. The metal cation can have a +1 or +2 charge. Exemplary non-limiting metal cations include $Na^{+1}$, $K^{+1}$, $Mg^{+2}$, $Ca^{+2}$, $Co^{+2}$, and $Zn^{+2}$. A preferred metal cation is $Mg^{+2}$.

In an embodiment, the oxygen plasma treated metal oxide layer comprises oxides of silicon(IV) and optionally silicon(IV) bearing one or more hydroxy groups. In another embodiment, the metal oxide layer comprises oxides of hafnium(IV) and optionally hafnium(IV) bearing one or more hydroxy groups.

The SAM is formed using a SAM precursor compound having a structure in accordance with formula (2):

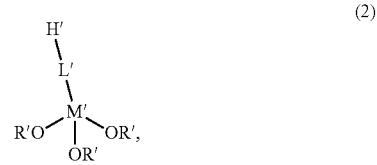

(2)

wherein

H' is a monovalent radical comprising a nitrogen heterocycle,

L' is any suitable divalent linking group comprising 1-20 carbons, and

M' is silicon(IV) or hafnium(IV), and each R' is an independent C1-C6 hydrocarbon group.

More specific R' groups include methyl, ethyl, n-propyl, n-butyl, n-pentyl, n-hexyl, and phenyl.

A specific SAM precursor compound is N-(3-triethoxysilylpropyl)-4,5-dihydroimidazole (DHIPS):

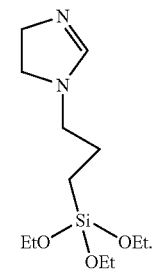

The following section presents methods of preparing a patterned biopolymer layer comprising DNA and/or a DNA-CNT disposed on an underlying surface of a SAM. It should be understood that the diagrams are for illustration purposes and are not drawn to scale. A cross-hatched rectangular shape is used to represent the mixture of biopolymer, metal cation and optional carbon nanotube.

Methods of Forming Patterned Biopolymer Layer

The following methods illustrate a patterned biopolymer layer can be prepared on a non-patterned or patterned SAM.

The term "disposed" refers to a layer in contact with a surface of another layer. "Disposing" or "applying" refer to forming a layer to be in contact with a surface of another layer, without limitation as to the method employed unless otherwise stated, with the proviso that the desirable characteristics of the disposed or applied layer are obtained, such as uniformity and/or thickness.

Method 1

FIGS. 1A-1E are layer diagrams illustrating formation of a patterned biopolymer layer on a patterned SAM formed by ultraviolet direct writing. This process does not use a patterned resist layer.

A substrate 100 (FIG. 1A) comprises a top surface 101. Top surface 101 is composed of zero valent silicon and/or zero valent hafnium. Substrate 100 can comprise one (shown) or more compositionally distinct layers (not shown). Treating top surface 101 with an oxygen plasma forms modified substrate 110 (FIG. 1B). Modified substrate 110 comprises a metal oxide layer 111 disposed on bottom layer 112. Top surface 113 of metal oxide layer 111 comprises a nucleophilic hydroxy group capable of forming a covalent bond with a SAM precursor compound. In an embodiment, the chemically reactive surface group is an M"—OH group, where M" is silicon(IV) or hafnium(IV). The M"—OH group reacts with the SAM precursor compound to form an M"-O-M' group, where M' is silicon(IV) or hafnium(IV) of the SAM precursor compound. Bottom layer 112 can comprise one (shown) or more compositionally distinct layers (not shown). As a non-limiting example, bottom layer 112 can be zero valent silicon or zero valent hafnium.

Metal oxide layer 111 can have a thickness in the range of about 5 nm to about 10 micrometers. In an embodiment, metal oxide layer has a thickness in the range of about 10 nm to 1 micrometer.

As a non-limiting example, substrate 100 can be a silicon wafer. Subjecting the silicon wafer to an oxygen plasma at 250 W, 300 mTorr for about one minute generates a modified substrate 110 comprising a metal oxide layer 111 and a bottom layer 112. The metal oxide layer 111 comprises oxides of silicon(IV) and a top surface 113 comprising silicon(IV)-hydroxide groups. Bottom layer 112 comprises zero valent silicon.

The SAM can be prepared using any suitable technique (e.g., spin casting, chemical vapor deposition (CVD), dip coating). Preferably, the SAM precursor compound is deposited onto metal oxide layer 112 using chemical vapor deposition (CVD), thereby forming layered structure 120 (FIG. 1C). Layered structure 120 comprises SAM 121 having top surface 122. SAM 121 is covalently bonded to metal oxide layer 111. SAM 121 is a monolayer having a thickness in the range of about 0.1 nm to about 15 nm.

Figure 1D:
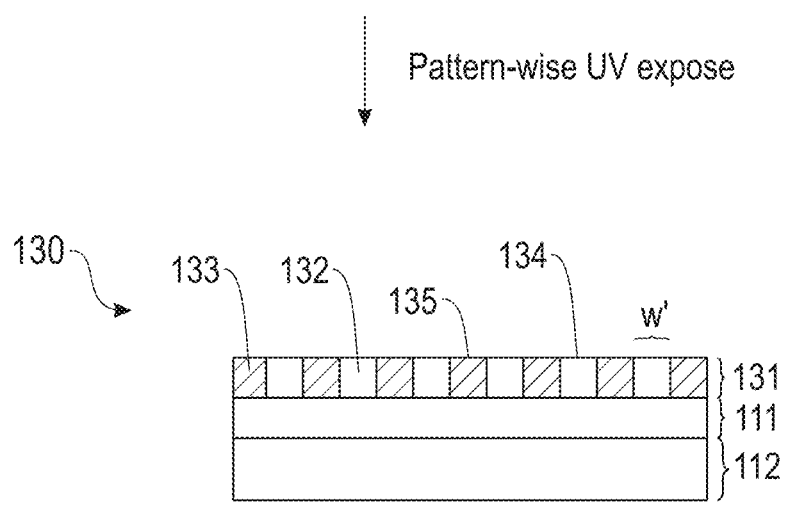

SAM 121 can then be pattern-wise chemically altered (e.g., by exposure to ultraviolet light (UV) through a suitable mask and/or by direct writing using UV or electron beam). For ultraviolet exposures, a wavelength (e.g., 248 nm, 193 nm, 13 nm) and dosage are selected to induce a chemical transformation of the exposed SAM regions that decreases the chemical affinity of the exposed SAM regions for the biopolymer compared to the non-exposed SAM regions, forming layered structure 130 (FIG. 1D). Layered structure 130 comprises patterned SAM 131 disposed on, and covalently linked to, metal oxide layer 111. Patterned SAM 131 comprises i) non-exposed SAM regions 132 of width w' having top surfaces 134 and ii) exposed SAM regions 133 having top surfaces 135. Top surfaces 135 of exposed regions 133 have substantially less affinity for a given biopolymer compared to top surfaces 134 of non-exposed SAM regions 132. The given biopolymer preferentially binds (adsorbs) to top surfaces 134 of the non-exposed SAM regions 132. Depending on the dosage, top surfaces 134 can be elevated relative to top surfaces 135 as a result of ablation of SAM material in exposed SAM regions 132 (not shown), or top surfaces 134 can have the same elevation as top surface 135 (shown) due to a non-ablative chemical change of exposed SAM regions 132. That is, non-exposed SAM regions 132 and exposed SAM regions 133 can have the same thickness (shown) or different thickness (not shown). Any differences in thickness have minimal influence on the placement of the biopolymer. That is, the patterned SAM 131 serves primarily as a chemical pre-pattern for biopolymer adsorption, where top surfaces 134 of non-exposed SAM regions 132 have preferential affinity for the given biopolymer.

The deposition step of the nitrogen heterocycle-containing compound can employ a contact mask, thereby forming a patterned SAM 131 directly. Alternatively, the compound comprising the nitrogen heterocycle can be deposited onto specific areas of the substrate using a photosensitive or electron beam sensitive resist mask disposed on the oxide layer. Selectively removing the resist mask leaves a patterned SAM disposed on the oxide layer.

The top surface of the patterned SAM layer contains the nitrogen heterocycle, which is capable of selectively binding the biopolymer by non-covalent interactions. The biopolymer can be bound in a complex with a second biopolymer, a carbon nanotube, a material other than a biopolymer or a carbon nanotube, or a combination thereof. In an embodiment, the patterned SAM regions comprising the nitrogen heterocycle selectively bind the DNA, and the DNA is bound to a second material selected from the group consisting of a second DNA, a carbon nanotube, a material other than DNA or a carbon nanotube, and combinations thereof. The patterned SAM can selectively orient the DNA, the second material, and/or the carbon nanotube along an axis of the patterned SAM.

Figure 1E:
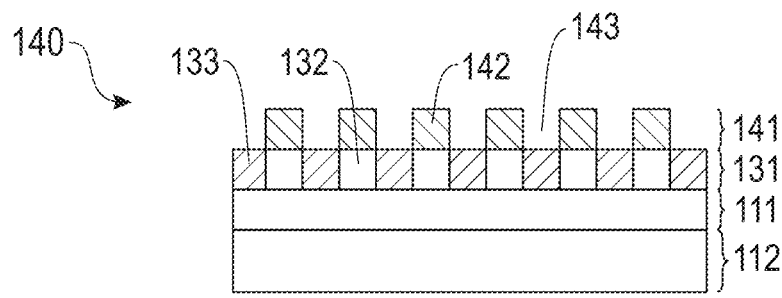

Continuing with the example of FIG. 1D, treatment of layered structure 130 with an aqueous mixture comprising a biopolymer, a metal cation, and optionally a carbon nanotube, forms layered structure 140 (FIG. 1E). The biopolymer and carbon nanotube are preferably in the form of a complex (e.g., a DNA-CNT). Layered structure 140 comprises patterned biopolymer layer 141 disposed on non-exposed regions 132 of patterned SAM 131. Patterned biopolymer layer 141 comprises biopolymer features 142 comprising the biopolymer, the metal cation, and optionally the carbon nanotube. Biopolymer features 142 are separated by recessed regions 143, which are located primarily over exposed SAM regions 133 which contain chemically degraded bound compound. SAM regions 133 have none of, or substantially none of, the biopolymer, metal cation, and carbon nanotube adsorbed thereon. The metal cation of patterned biopolymer layer 141 can contact the biopolymer and/or the H' group of patterned SAM 131. It should be understood that the mixture of biopolymer, metal cation, and optional carbon nanotube can occupy all (shown) or a portion (not shown) of available top surface 134 (FIG. 1D) of non-exposed SAM regions 132.

When a conductive carbon nanotube is present, biopolymer features 142 can serve as precursors to conductive paths between two subsequently deposited metal contacts. This also applies to the methods described below. Preferably, the biopolymer is removed using an agent capable of fragmenting the biopolymer and/or otherwise chemically degrading the structure of the biopolymer (e.g., DNA-ExitusPlus™ (a trademark of PanReac Applichem GmbH, Darmstadt, Germany), nucleases, proteases, hydroxide bases, sulfonic acids, thermal degradation) before deposition of the metal contacts.

Method 2

FIGS. 2A-2D are cross-sectional layer diagrams illustrating a process in which a patterned resist layer is formed on a non-patterned SAM before deposition of the biopolymer. An etch step selectively removes material of the SAM (shown) or chemically alters the SAM (not shown) of the recessed regions of the resist pattern, minimizing chemical affinity of the biopolymer for the etched surfaces. After stripping any remaining resist, a patterned biopolymer layer is formed on the top surfaces of the SAM. The biopolymer does not adsorb to the etched surfaces of the recessed areas of the patterned SAM.

Layer structure 200 (FIG. 2A) comprises SAM 121 (non-patterned) disposed on, and covalently bonded to, metal oxide layer 111, as described above for layered structure 120

(FIG. 1C). SAM 121 has top surface 122. Metal oxide layer 111 is disposed on bottom layer 112. Bottom layer 112 comprises substrate material (e.g., zero valent silicon, zero valent hafnium). Bottom layer 112 can comprise one (shown) or more compositionally distinct layers (not shown). SAM 121 has a thickness of about one monolayer of the SAM precursor compound used to prepare SAM 121.

Figure 2A:
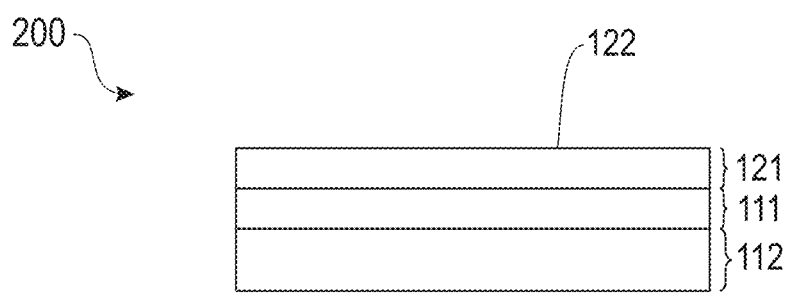
FIGS. 2A-2D are cross-sectional layer diagrams illustrating formation of a patterned biopolymer layer by a process utilizing a patterned resist layer on a non-patterned SAM before deposition of the biopolymer. The patterned resist layer can be formed using a positive tone or negative tone resist.
Figure 2B:
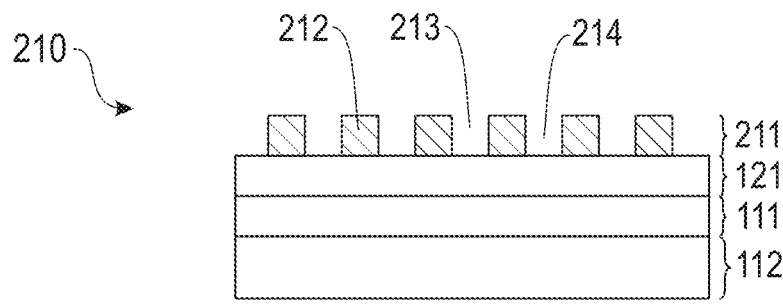

A patterned resist layer is formed on SAM 121 using any suitable lithographic process, resulting in layered structure 210 (FIG. 2B). Layered structure 210 comprises patterned resist layer 211 disposed on SAM 121. Patterned resist layer 211 comprises resist features 212 separated by recessed regions 213 whose bottom surfaces 214 comprise material of SAM 121 having no resist material, or substantially no resist material, disposed thereon. The resist can be any suitable positive or negative-working resist (e.g., JSR AR 20172-11, poly(methyl methacrylate), KRS (a proprietary resist, see Tanenbaum et al., Journal of Vacuum Science & Technology B, Nanotechnology and Microelectronics: Materials, Processing, Measurement, and Phenomena 14, 3829 (1996), abstract), HSQ (hydrogen silasesquioxane), JSR AR 2073-11). The resist layer can be exposed using any suitable lithographic technique, including direct e-beam writing and/or pattern-wise exposure to ultraviolet light. The exposed resist layer can be developed using any suitable developer, including aqueous base developers and/or an organic solvent (e.g., anisole).

Figure 2C:
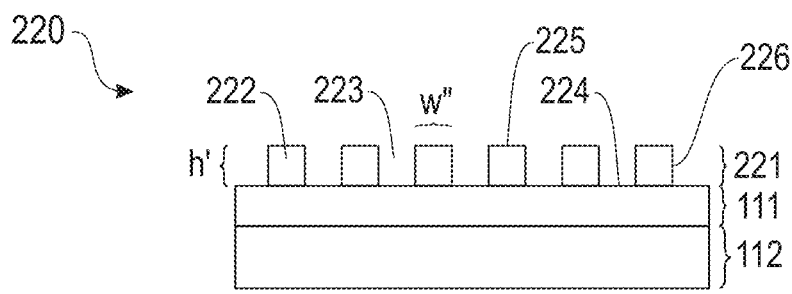

SAM material of bottom surfaces 214 of recessed areas 213 can be selectively removed (shown) using a suitable etch (e.g., oxygen reactive ion etch) or can be chemically altered (e.g., by exposure to UV) in order to minimize chemical affinity of bottom surfaces 214 to the biopolymer. An etch can also remove portions of resist features 212. Any remaining resist material thereafter can be removed using a suitable stripping agent (e.g., EKC265™, tetramethyl ammonium hydroxide (TMAH), acetone, anisole), thereby forming layered structure 220 (FIG. 2C). In this instance, layered structure 220 comprises patterned SAM 221 comprising SAM features 222 of width w" separated by recessed regions 223 whose bottom surfaces 224 comprise material of metal oxide layer 111 having no SAM material, or substantially no SAM material, disposed thereon. Top surface 225 of SAM features 222 has preferential affinity for biopolymer adsorption compared to bottom surfaces 224. Sidewalls 226 of SAM features 222 are not of sufficient height h' to have substantial influence on the adsorption of the biopolymer.

Figure 2D:
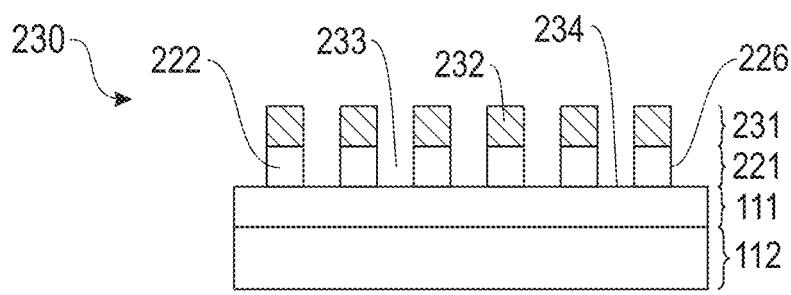

Treatment of layered structure 220 with an aqueous buffer solution comprising a biopolymer, a metal cation, and optionally a carbon nanotube, forms layered structure 230 (FIG. 2D). Layered structure 230 comprises patterned biopolymer layer 231 disposed on patterned SAM 221. Patterned biopolymer layer 231 comprises biopolymer features 232 comprising the biopolymer, the metal cation, and optionally the carbon nanotube. Biopolymer features 232 are separated by spatial regions 233 having bottom surfaces 234 that are free of, or substantially free of, biopolymer, metal cation, and carbon nanotube adsorbed thereon. The metal cation of patterned biopolymer layer 231 can be in contact with the biopolymer and/or the H' group of patterned SAM 221. It should be understood that the mixture of biopolymer, metal cation, and optional carbon nanotube can occupy all (shown) or a portion (not shown) of available top surface 225 of SAM features 222 (FIG. 2C).

Method 3

FIGS. 3A-3D are cross-sectional layer diagrams illustrating a process in which a patterned resist layer is formed on a metal oxide layer before forming a SAM.

Layer structure 300 (FIG. 3A) comprises metal oxide layer 111 having top surface 113 as described above for layer structure 110 of FIG. 1B. Metal oxide layer 111 is disposed on bottom layer 112. Bottom layer 112 comprises a substrate material (e.g., zero valent silicon, zero valent hafnium). Bottom layer 112 can comprise one (shown) or more compositionally distinct layers (not shown).

Figure 3A:
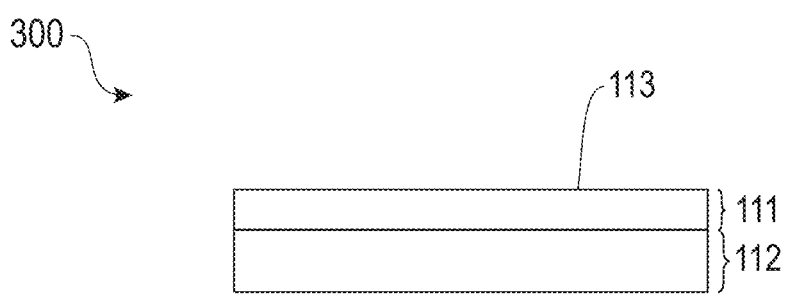
FIGS. 3A-3E are cross-sectional layer diagrams illustrating formation of a patterned biopolymer layer by a process in which a patterned resist layer is formed on a metal oxide layer and depositing a SAM-forming compound in the recessed areas of the patterned resist layer to form a patterned SAM.
Figure 3B:
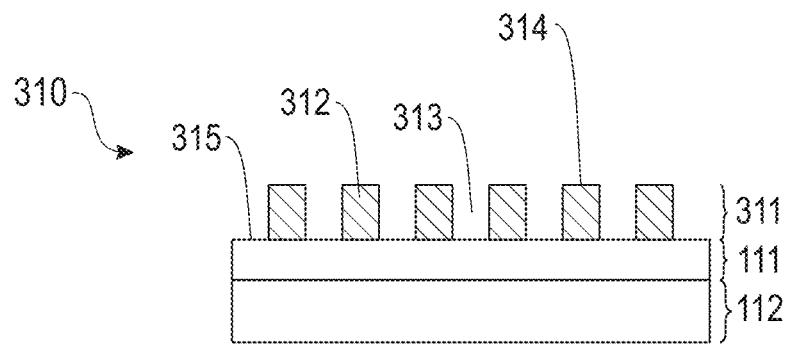

Using a suitable lithographic technique, a patterned resist layer is formed on metal oxide layer 111 of layered structure 300, thereby forming layered structure 310 (FIG. 3B). Layered structure 310 comprises patterned resist layer 311 disposed on metal oxide layer 111. Patterned resist layer 311 comprises resist features 312 having top surfaces 314 separated by recessed regions 313 whose bottom surfaces 315 comprise material of metal oxide layer 111. Bottom surfaces 315 are free of, or substantially free of resist material.

Figure 3C:
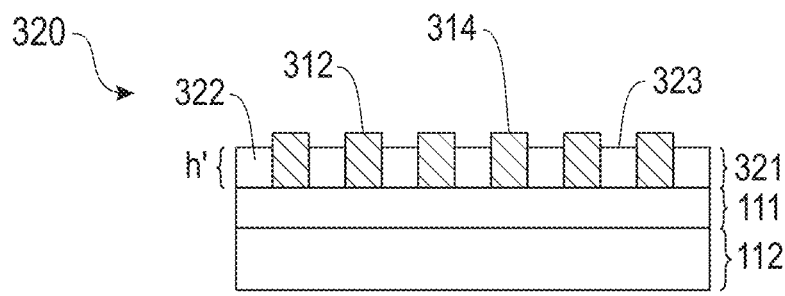

Layered structure 310 can be given an optional etch to remove any resist material disposed on bottom surfaces 315, providing a clean metal oxide surface in recessed regions 313 for treatment with SAM precursor compound. A portion of resist features 312 can be removed by this etch. Applying SAM precursor (e.g., by chemical vapor deposition) onto bottom surfaces 315, produces layered structure 320 (FIG. 3C). Layered structure 320 comprises patterned layer 321 comprising SAM features 322 disposed on bottom surfaces 315 of recessed regions 313 of patterned resist layer 311 (FIG. 3B). SAM features 322 have height h'.

Figure 3D:
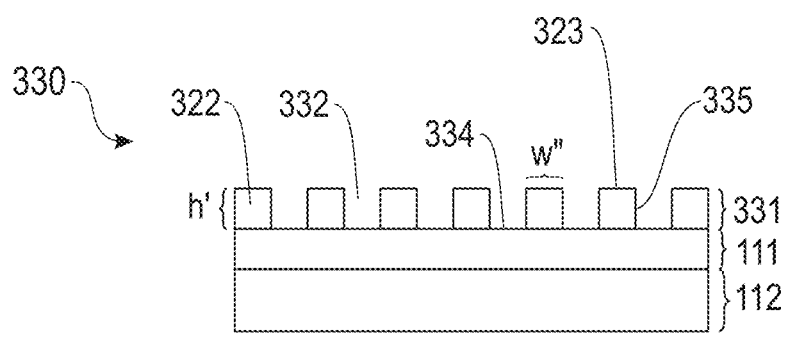

Stripping the resist of patterned layer 321 produces layered structure 320 (FIG. 3D). Layered structure 320 comprises patterned SAM 321 disposed on metal oxide layer 111. Patterned SAM 321 comprises SAM features 322 having top surfaces 323. SAM features 322 are separated by recessed regions 332 having bottom surfaces 334 composed primarily of metal oxide material and any residual resist. Bottom surfaces 334 are free of, or substantially free of, SAM material. Top surfaces 323 of SAM features 322 have preferential affinity for a biopolymer compared to bottom surfaces 334. Sidewalls 335 of SAM features 322 have a height h' of about one monolayer of SAM precursor compound. Sidewalls 335 have little or no influence on the placement of the biopolymer.

Figure 3E:
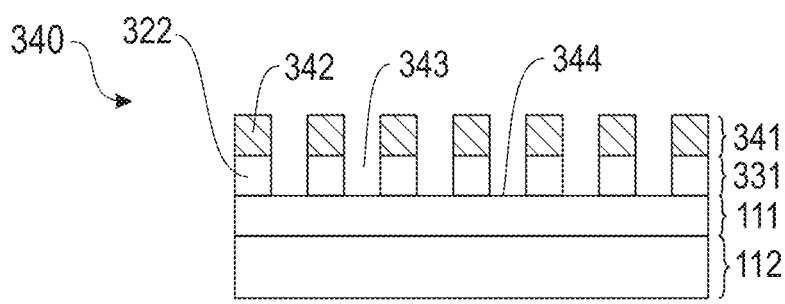

Treating layered structure 330 with an aqueous buffer solution comprising a biopolymer, a metal cation, and optionally a carbon nanotube, forms layered structure 340 (FIG. 3E). Layered structure 340 comprises patterned biopolymer layer 341 disposed on patterned SAM 331. Patterned biopolymer layer 341 comprises biopolymer features 342 comprising the biopolymer, the metal cation, and optionally carbon nanotube. Biopolymer features 342 are separated by recessed regions 343, which have bottom surfaces 344 composed primarily of material of metal oxide layer 111. Bottom surfaces 344 are free of, or substantially free of, biopolymer, metal cation, and carbon nanotube. The metal cation of patterned biopolymer layer 341 can be in contact with the given biopolymer and/or the H' group of the patterned SAM 331. It should be understood that the mixture of the given biopolymer, metal cation, and optional carbon nanotube can occupy all (shown) or a portion (not shown) of available top surface 323 of SAM features 322 (FIG. 3D).

Method 4

FIGS. 4A-4D are cross-sectional layer diagrams illustrating a process in which patterning occurs after forming a non-patterned biopolymer layer on a non-patterned SAM.

Layer structure 400 (FIG. 4A) comprises metal oxide layer 111 having top surface 113 as described above for layer structure 110 of FIG. 1B. Metal oxide layer 111 is disposed on bottom layer 112. Bottom layer 112 comprises a substrate material (e.g., zero valent silicon, zero valent hafnium). Bottom layer 112 can comprise one (shown) or more compositionally distinct layers (not shown).

Figure 4C:
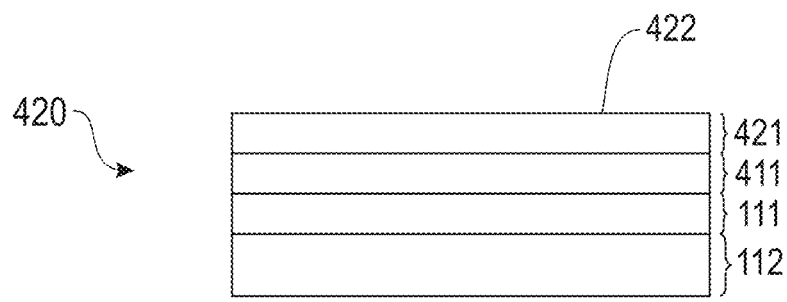

Applying a SAM precursor compound to top surface 113 forms layered structure 410 (FIG. 4B). Layered structure 410 comprises SAM 411 having top surface 412. Treatment of top surface 412 with an aqueous buffer solution comprising a biopolymer, a metal cation, and optionally a carbon nanotube, forms layered structure 420 (FIG. 4C). Layered structure 420 comprises biopolymer layer 421 disposed on SAM 411. Biopolymer layer 421 has top surface 422. SAM 411 and biopolymer layer 422 are not necessarily patterned.

Figure 4D:
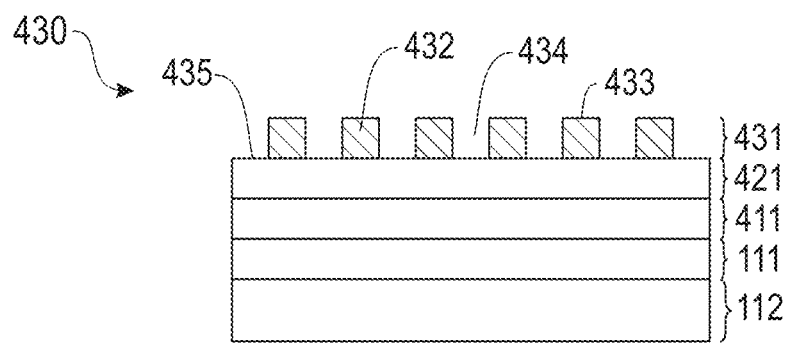

Using a suitable lithographic technique, a patterned resist layer is formed on top surface 422 of biopolymer layer 421 of layered structure 420, thereby forming layered structure 430 (FIG. 4D). Layered structure 430 comprises patterned resist layer 431 disposed on biopolymer layer 421. Patterned resist layer 431 comprises resist features 432 having top surfaces 433 separated by recessed regions 434 whose bottom surfaces 435 comprise material of biopolymer layer 421.

Figure 4E:
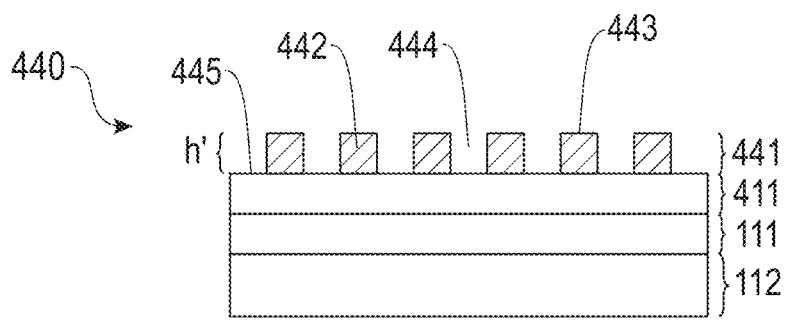

Patterned resist layer 431 is transferred to one or more of the underlying layers using suitable etch conditions, selectively removing biopolymer material of and below recessed regions 434, resist features 432, and optionally SAM 411. Any residual resist material can be removed using an optional stripping agent, producing layered structure 440 (FIG. 4E). Layered structure 440 comprises patterned biopolymer layer 441 disposed on SAM 411, which can be patterned (not shown) by the etch conditions or non-patterned (shown). Patterned biopolymer layer 441 comprises biopolymer features 442 having top surfaces 443 separated by recessed areas 444 having bottom surfaces 445.

Biopolymer layer 421 and SAM 411 can be patterned in one or more etch sequential etch steps. After the one or more etch steps, any remaining resist material of the patterned resist layer 431 can be removed using a suitable stripping agent (e.g., EKC 265), The resulting patterned biopolymer layer can be disposed on a patterned or non-patterned SAM.

Method 5

FIGS. 5A-5D are cross-sectional layer diagrams illustrating a process in which a patterned resist layer is formed on a non-patterned SAM before applying the biopolymer.

Layered structure 500 (FIG. 5A) comprises SAM 121 having top surface 122 disposed on metal oxide layer 111, as described above for layered structure 200 (FIG. 2A). Metal oxide layer 111 is disposed on bottom layer 112. Bottom layer 112 comprises a substrate material (e.g., zero valent silicon, zero valent hafnium). Bottom layer 112 can comprise one (shown) or more compositionally distinct layers (not shown).

Figure 5A:
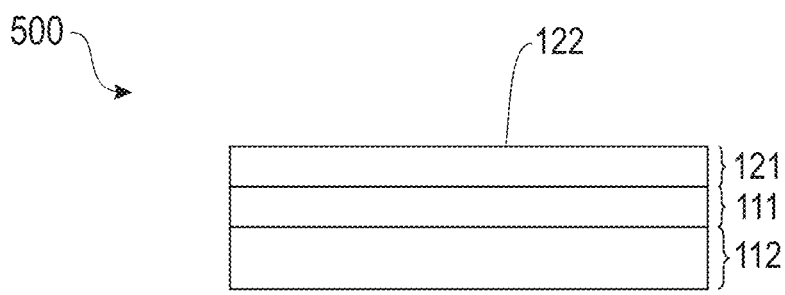
FIGS. 5A-5D are cross-sectional layer diagrams illustrating formation of a patterned biopolymer layer by a process in which a patterned resist layer is formed on a non-patterned SAM, and depositing the biopolymer in recessed regions of the resist pattern.
Figure 5B:
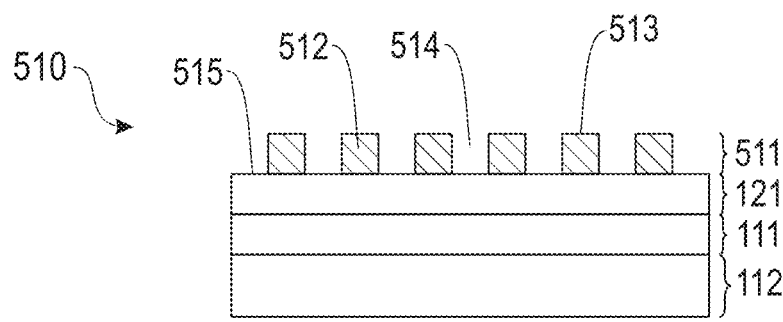

A patterned resist layer is formed on top surface 122 of SAM 121, thereby forming layered structure 510 (FIG. 5B). Layered structure 510 comprises patterned resist layer 511 disposed on SAM 121. Patterned resist layer 511 comprises resist features 512 having top surfaces 513 separated by recessed regions 514 whose bottom surfaces 515 comprise material of SAM 121.

Figure 5C:
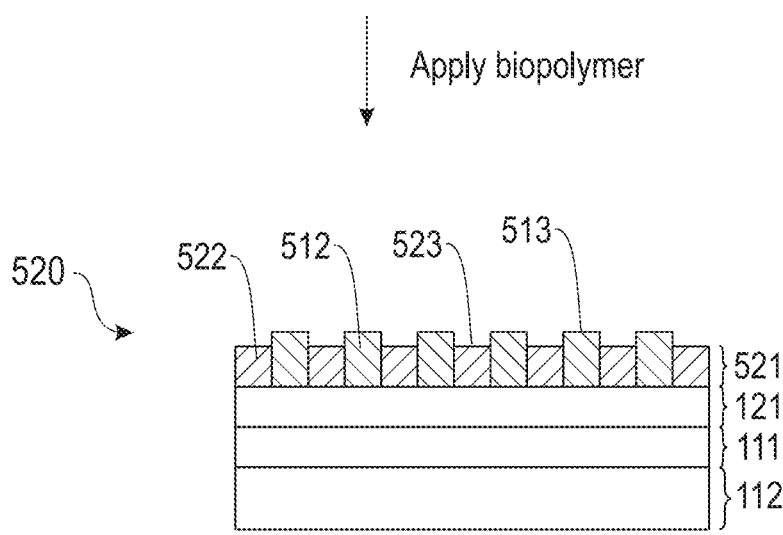

Treatment of bottom surfaces 515 with an aqueous buffer solution comprising a biopolymer, a metal cation, and optionally a carbon nanotube, forms layered structure 520 (FIG. 5C). Layered structure 520 comprises composite layer 521 comprising biopolymer features 522 having top surfaces 523 disposed on SAM 121 in recessed regions 514 (FIG. 5B). Composite layer 521 further comprises resist features 512 having top surfaces 513. Resist features 512 are in contact with biopolymer features 522 and are disposed on SAM 121. SAM 121 is not necessarily patterned.

Figure 5D:
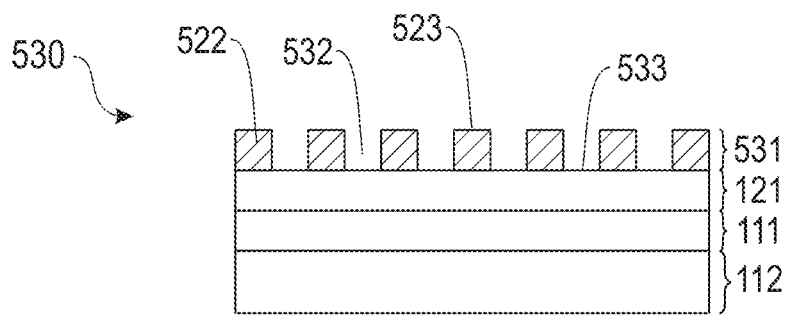

Selectively stripping resist features 512 using a suitable stripping agent forms layered structure 530 (FIG. 5D). Layered structure 530 comprises patterned biopolymer layer 531 disposed on SAM 121. Patterned biopolymer layer 531 comprises biopolymer features 522 having top surfaces 5233 separated by recessed areas 532 having bottom surfaces 533 that are free of, or substantially free of, resist material.

A SAM feature can have a long axis (e.g., as in a line-space pattern, where the SAM feature has an elevated surface on which the biopolymer-CNT complex is disposed). In an embodiment, the long axis of the biopolymer-CNT complex aligns within about 10° to about 20° of the long axis of the SAM features.

Substrates

The substrate is the layered structure on which the SAM is disposed. The substrate has a main plane, which is parallel to the bottom-most layer of the substrate. The substrate can comprise one or more layers of materials arranged in a stack, more specifically materials used in the fabrication of semiconductor devices. As non-limiting examples, the substrate can include a bottom layer (e.g., silicon wafer, metal foil), hard mask layer, dielectric layer, metal oxide layer, silicon oxide layer, silicon nitride, titanium nitride, hafnium oxide, and/or an anti-reflection layer (ARC).

The patterned top surface of a substrate can be a "graphoepitaxial pre-pattern" or a "chemical pre-pattern" for controlling placement and/or orientation of a material disposed thereon. Each type of pre-pattern can have topographical features (e.g., as in a patterned resist layer). A graphoepitaxial pre-pattern influences placement and orientation of the disposed material by the topography and surface properties of the pre-pattern. A "chemical pre-pattern" influences placement and orientation of a disposed material predominantly by way of the surface properties of the different regions of the pre-pattern. No sharp dimensional limits differentiate these two pre-pattern categories. The patterned SAM, which has a thickness of about one monolayer, acts primarily as a chemical pre-pattern for binding and orienting the DNA-CNT. A parallel orientation of the DNA-CNT macromolecules is desired, which is controlled by the dimensions of the DHIPS pre-pattern.

Carbon Nanotubes

A CNT is a closed-cage structure composed of $sp^2$-hybridized carbon atoms arranged in hexagons and pentagons. The CNT can be a single-walled nanotube (SWNT), which is a hollow tube like structure, or multi-walled nanotube (MWNT), which resembles a set of concentric cylinders. In an embodiment, the CNT is a single-walled nanotube. The CNT can be doped with elements other than carbon (e.g., phosphorus, arsenic, boron and metals). A CNT can have metallic or semiconducting properties. These properties, in combination with their small dimensions, makes CNTs particularly attractive for use in the fabrication of nano-devices. In an embodiment, the CNT is a single wall carbon nanotube having semiconducting properties suitable for construction of a field effect transistor (FET).

The CNTs can be prepared by any number of methods known in the art and are commercially available (e.g., by high pressure carbon monoxide process (HiPCo) process, laser-evaporation of graphite, or carbon arc synthesis). Each end of the CNT can be closed or open. The central portion of the CNT can be hollow or filled with amorphous carbon.

The CNT can have an outer-most diameter of about 0.7 to about 500.0 nanometers (nm). Single walled carbon nanotubes generally have a single wall with an outer diameter of about 0.7 to about 3.0 nanometers (nm). Multiwalled carbon nanotubes generally have an outer diameter of about 3.5 to about 500 nm.

The CNT can have an aspect ratio (length:diameter) of greater than or equal to about 5, more specifically greater than or equal to about 100, even more specifically greater than or equal to about 1000.

The CNT can have a diameter polydispersity index (PDI) in a range of 1.0 to less than about 1.5, even more preferably 1.0 to less than about 1.3, and still more preferably 1.0 to less than about 1.1. In an embodiment, the CNT diameter is monodisperse (PDI in a range of 1.0-1.01).

Bio-Polymers

The bio-polymer is preferably a "nucleic acid", defined as a polymer of RNA, DNA, or peptide nucleic acid (PNA) that is single- or double-stranded, optionally containing synthetic, non-natural, or altered nucleotide bases. A nucleic acid in the form of a polymer of DNA can comprise one or more segments of complimentary DNA (cDNA), genomic DNA (gDNA), or synthetic DNA. The letters "a", "g", "t", "c" when referred to in the context of nucleic acids means the purine bases adenine (C5H5N5) and guanine (C5H5N5O) and the pyrimidine bases thymine (C5H6N2O2) and cytosine (C4H5N3O), respectively. The term "peptide nucleic acid" refers to a polymer of a, g, t, and c bases where the sugar-phosphate backbone of DNA and RNA has been replaced with a peptide backbone.

The nucleic acids include but are not limited to DNA, RNA and peptide nucleic acids. The nucleic acids may be either single stranded or double stranded and are functionalized at any point with a variety of reactive groups, ligands or agents. For example, the nucleic acid can be functionalized at its ends. The nucleic acid can be generated by synthetic means or may be isolated from nature by established protocols.

Functionalization of the nucleic acids can be conducted before or after the carbon nanotubes have been dispersed.

The nucleic acid can comprise a single base (e.g., poly A and/or poly T) or a plurality of different bases. As non-limiting examples, the nucleic acid can comprise 20 base pairs or more, 2,000 base pairs or more, 3,000 base pairs or more, or 4,000 base pairs or more.

In the interest of using DNA as a dispersion and patterning vehicle for CNTs for use in microelectronics, the DNA can have a linear extended length of up to about several micrometers. DNA length can also be expressed as the number of base pairs (bp) attached to the phosphate backbone of the DNA molecule.

The DNA used to form a DNA-CNT can be single-stranded DNA segment (ssDNA) or a double-stranded DNA segment (dsDNA). The ssDNA solutions are mixed with CNTs and sonicated at low temperatures to prevent overheating (in one example, about 4° C.). The DNA-CNT remains suspended in solution whereas un-complexed CNT will not remain suspended and can be removed by centrifugation. Typically, about 90% of the CNTs form a complex in a given preparation of a DNA-CNT.

Atomic force microscopy (AFM) indicates that a DNA-CNT complex using SWNT and ssDNA comprises the single stranded DNA helically wound around the single walled carbon nanotube. The DNA-CNTs can have diameters between about 1 nm and about 1000 nm and lengths between about 0.7 micrometers and about 2.0 micrometers. Atomic force microscopy (AFM) also indicates that on any particular CNT the pitch of the single stranded DNA wrapping is constant, in one example about 60 nm, but from single walled CNT to single walled CNT the pitch can vary. In one example the pitch of the ssDNA wrapping on any particular SWNT is a constant between about 12 nm and about 80 nm.

Bio-Polymer Layer

High density arrays of DNA-CNTs can be produced by nitrogen-drying droplets of an aqueous buffer solution of the DNA-CNT on an above-described pattern SAM.

The following examples demonstrate (1) wafer scale uniform DHIPS derivatization of silicon oxide and hafnium oxide top surfaces of substrates, (2) biopolymer deposition on DHIPS-derivatized substrates under physiological conditions (pressure of 1 atmosphere, a temperature range of 20-40° C., and pH of 6-8.5) as well as from DNA nanostructure compatible buffers, (3) creating patterned DHIPS-derivatized oxide substrates, and (4) selective placement of DNA-CNT or DNA on DHIPS features of patterned DHIPS layers.

EXAMPLES

Materials used in the following examples are listed in Table 1.

TABLE 1

| Abbreviation | Description | Source |
|---|---|---|
| DHIPS | N-(3-Triethoxysilylpropyl)-4,5-dihydroimidazole | GELEST |
| EDTA | Ethylenediaminetetraacetic acid | Sigma Aldrich |
| | 1X TAEMg buffer | Sigma Aldrich |
| | 1X TBE buffer | Sigma Aldrich |
| Tris | Tris(hydroxymethyl)aminomethane | Sigma Aldrich |
| TMAH | Tetramethyl ammonium hydroxide | Sigma Aldrich |
| IsoNanotubes-S | 90% semiconducting single walled carbon nanotubes | NanoIntegris |
| DNA | Deoxyribonucleic acid | Integrated DNA Technologies |

DNA Sequences

The following DNA were prepared by Integrated DNA Technologies and hybridized as double stranded DNA before CNT dispersal:

```
SEQ ID NO. 1:
ttttttttttttttttttttttttttttttttttttttttgttgcgaggt
cttgccgaca

SEQ ID NO. 2:
ttttcgttgtcggcaagacctcgcaac
```

Derivatization of Substrates

DHIPS has the following structure.

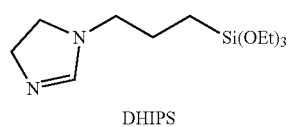

DHIPS

To modify silicon substrates, the substrates were treated with oxygen reactive ion etch (ME) in a March XP 20 plasma cleaner using the top wafer platter (platter separation 2.5 cm) to activate the $SiO_2$. The ME was done using 300 mTorr oxygen atmosphere at 10 watts for 20 seconds. The plasma treated wafer contained a $SiO_2$ surface (acidic metal oxide containing Si(IV)—OH groups). The silicon oxide surface layer was then derivatized using the following hotplate method or silylation oven method.

Example 1

Hotplate method of derivatization of silicon oxide with DHIPS. In this method, the plasma treated silicon wafer was dried and heated to 185° C. for 30 minutes in a table-top chemical vapor deposition (CVD) chamber under a steady flow of dry nitrogen. A 4 dram sample vial containing N-(3-triethoxysilylpropyl)-4,5-dihydroimidazole (DHIPS, 2.5 mL) was placed in the chamber near the nitrogen inlet for 25 minutes. After removing the vial, the DHIPS-modified substrate was kept in the chamber at 100° C. for an additional hour. The DHIPS-modified substrate was maintained in a nitrogen box until use.

Example 2

Silylation oven method of derivatization of silicon oxide with DHIPS. In this method, the oven accommodated multiple wafers of various sizes (1 to 14 inch wafers were tested). The oven was pre-heated overnight at ~185° C. with wafer carriers inside the chamber. The plasma treated silicon wafer containing a metal oxide surface was placed in the pre-heated oven chamber within the wafer carrier and dried for 2 to 3 hours prior to CVD deposition of DHIPS under dry $N_2$. A sample vial containing DHIPS (50 mL) was also continuously purged with dry $N_2$ during the wafer drying. After drying the wafer, the DHIPS was introduced into the oven chamber through a series of 0.1 mL pulses at 50 Torr. Deposition times of 900 and 300 seconds were used for obtaining uniform wafer coverage. The oven temperature was lowered to room temperature under $N_2$ prior to removal of the DHIPS-modified wafers. Finally, the DHIPS-modified wafers are maintained in the dry $N_2$ box until use.

DHIPS Deposition Results

Figure 6A:
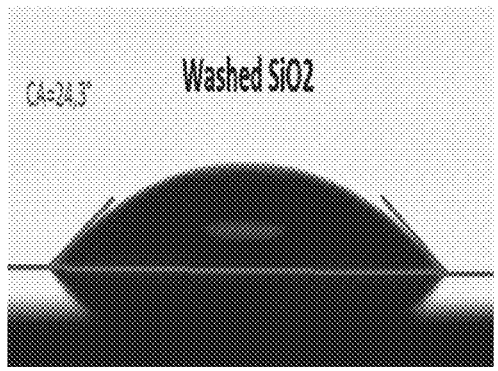
FIGS. 6A-6D are images showing the change in contact angle (CA) when a silicon oxide surface is washed (FIG. 6A, CA=24.3°), oxygen plasma treated (FIG. 6B, CA=14.2°), treated with N-(3-triethoxysilylpropyl)-4,5-dihydroimidazole (DHIPS) using the hot plate method after oxygen plasma treatment (FIG. 6C, CA=33.8°), and treated with DHIPS using the oven vapor deposition method after oxygen plasma treatment (FIG. 6D, CA=61.6°).
Figure 6B:
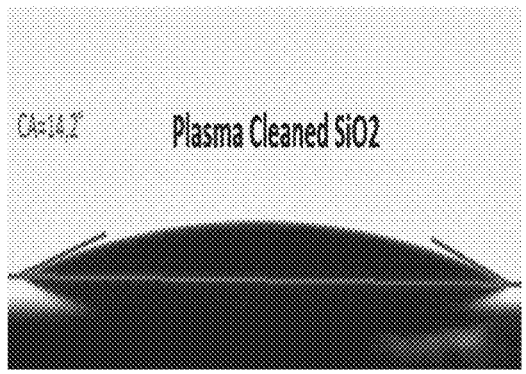
Figure 6C:
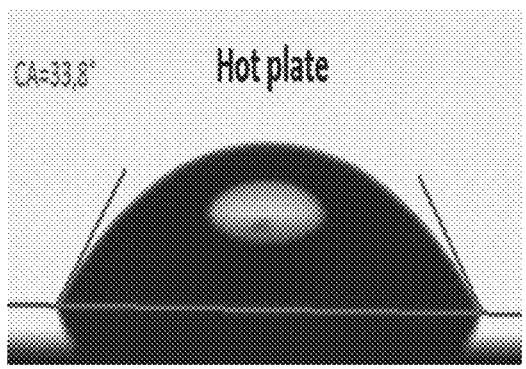
Figure 6D:
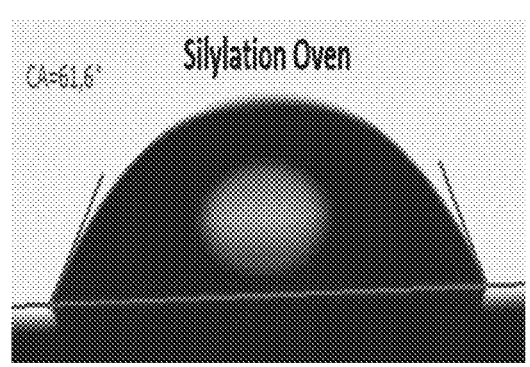

The reproducibility and quality of the DHIPS modification of the $SiO_2$ surface was evaluated using contact angle of water, x-ray photoelectron spectroscopy (XPS), and atomic force microscopy (AFM) techniques primarily. FIGS. 6A-6D are images showing the change in contact angle (CA) when a silicon oxide surface is washed in a bath sonication with dichloroethane (DCE) for 1 minute followed by another minute in isopropyl alcohol (IPA) and then dried with compressed $N_2$ (FIG. 6A, CA=24.3°), plasma cleaned (FIG. 6B, CA=14.2°), DHIPS treated using the hot plate method (FIG. 6C, CA=33.8°), and DHIPS treated using the silylation oven method (FIG. 6D, CA=61.6°). A higher CA is desirable. The cleaned $SiO_2$ contact angle changed from about 10° to about 65° on average when the surface nitrogen content increased from 0% to over 2% on average after derivatization with DHIPS based on elemental analysis of the surface by XPS.

Figure 7:
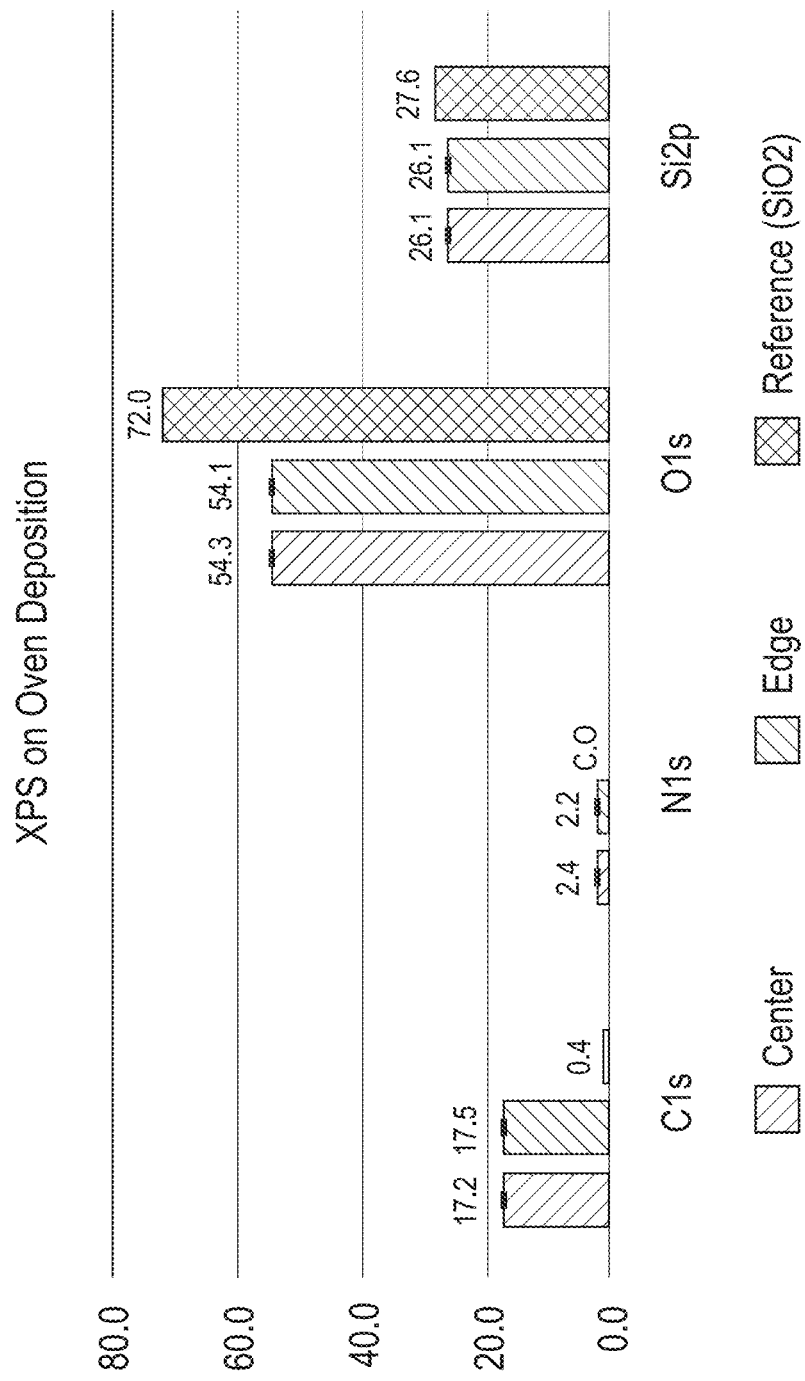
FIG. 7 is a bar graph comparing the XPS analysis of i) a DHIPS-treated silicon oxide surface formed using the oven method after oxygen plasma treatment of the silicon oxide surface and ii) a reference silicon oxide surface.

FIG. 7 (bar graph) compares the XPS analysis of a DHIPS treated silicon oxide surface deposited using the silylation oven method and a reference silicon oxide surface. An increase in surface nitrogen percentage and a decrease in surface oxygen percentage were observed after DHIPS deposition using the silylation oven method. The XPS analysis also revealed similar nitrogen content at the wafer edge and center, demonstrating uniform coverage over the wafer. Wafer diameters of 1 inch to 14 inches were coated uniformly using the silylation oven deposition method.

Figure 8:
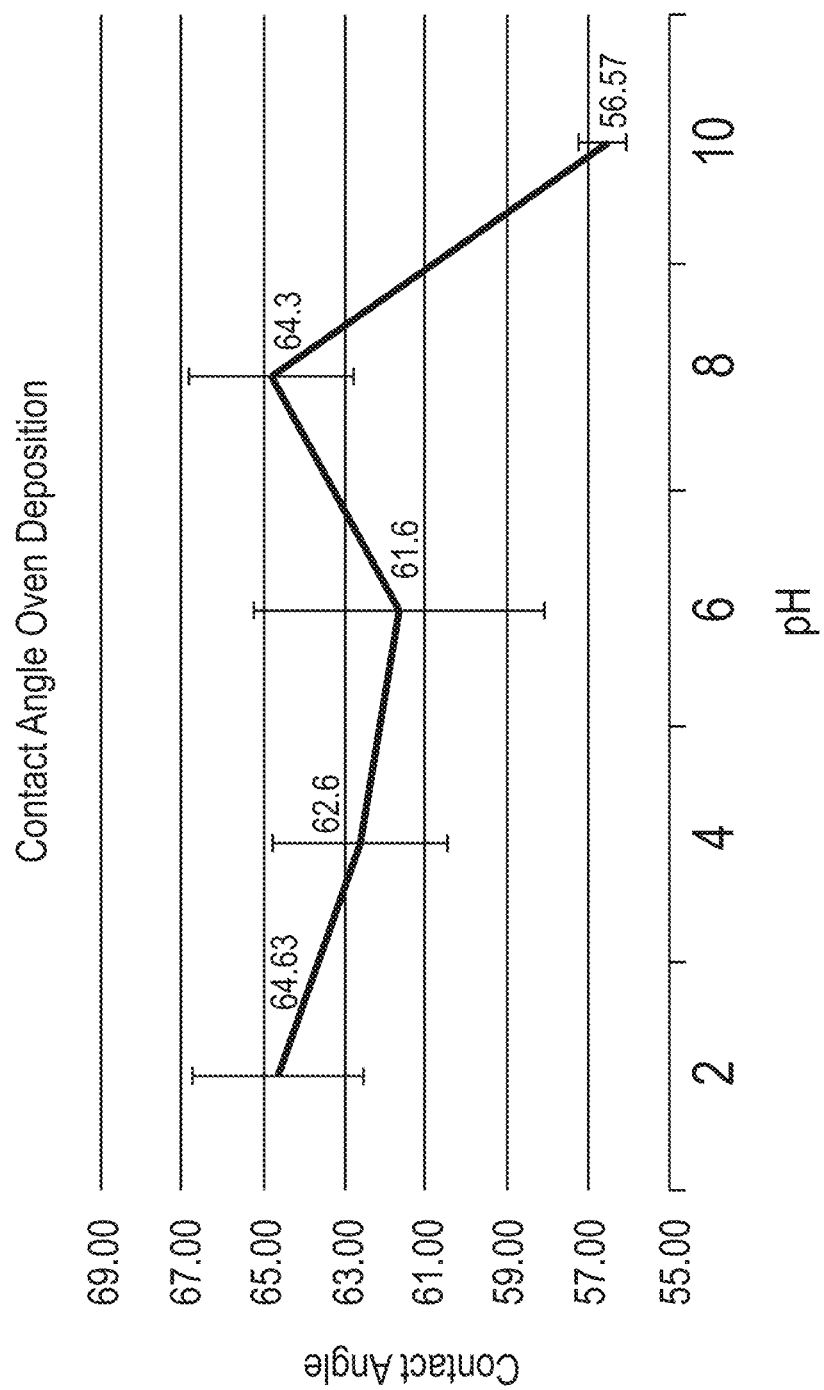
FIG. 8 is a graph showing the effect of pH on the contact angle for a DHIPS-treated silicon oxide surface formed using the oven method after oxygen plasma treatment of the silicon oxide surface.

FIG. 8 (graph) shows the effect of pH on the contact angle for a DHIPS treated silicon oxide surface deposited using the silylation oven method. A contact angle of about 61 to about 64 was observed for a pH in the range of 2-8.

Figure 9:
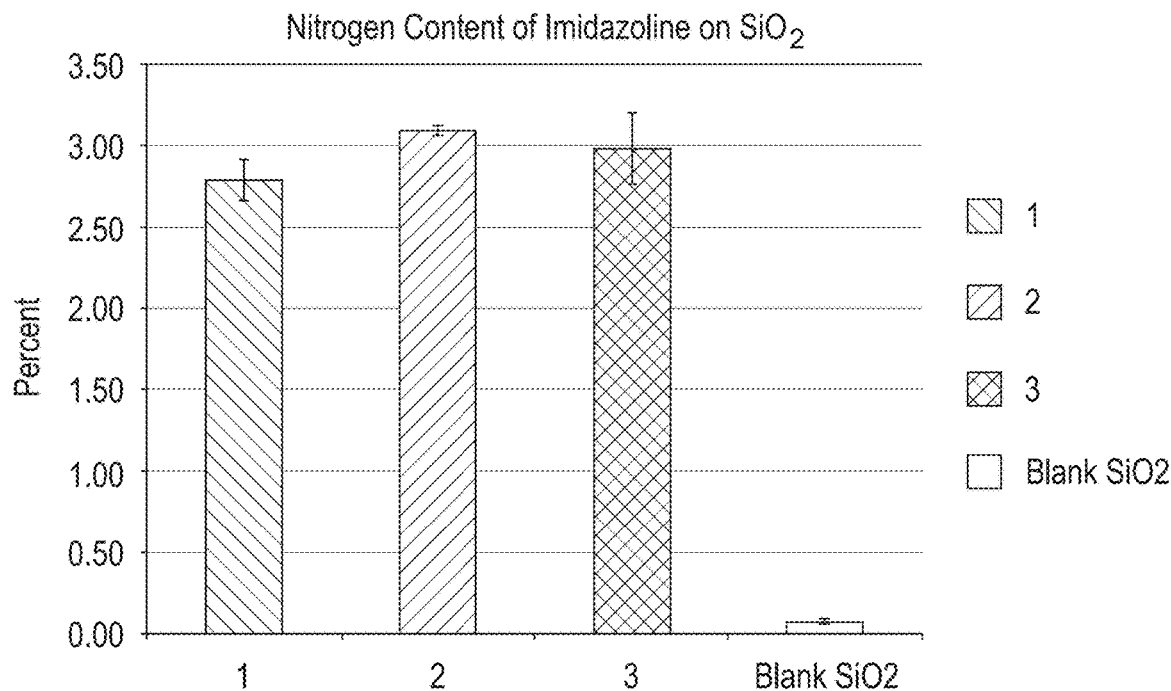
FIG. 9 is a bar graph comparing the nitrogen analysis after oven deposition of DHIPS of 3 samples using a deposition time of 900 seconds.

FIG. 9 (bar graph) compares the XPS nitrogen analysis of three DHIPS-modified $SiO_2$ samples after 900 second silylation oven deposition and equal volumes of DHIPS. The XPS data show the variation in nitrogen content was about 10%.

Figure 10:
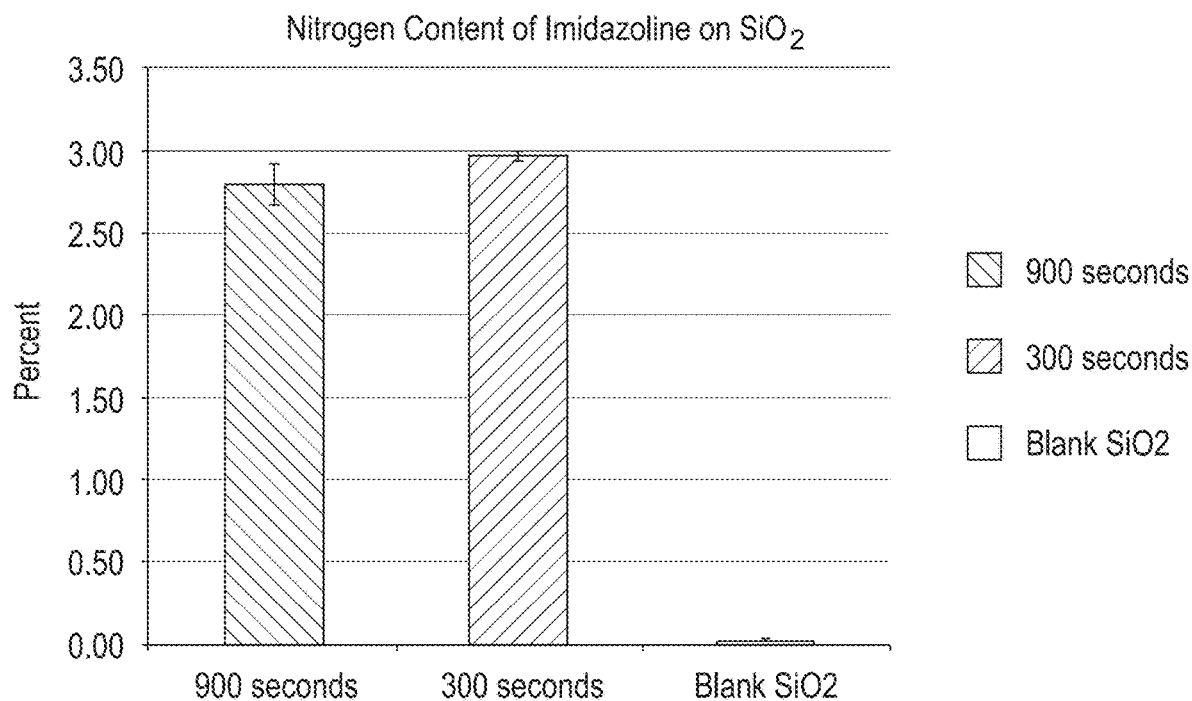
FIG. 10 is a bar graph comparing the nitrogen analysis after oven deposition of DHIPS for deposition times of 900 and 300 seconds and a constant volume of DHIPS.

FIG. 10 (bar graph) compares the XPS nitrogen analysis after silylation oven deposition times of 900 and 300 seconds and equal volume of DHIPS. The variation in nitrogen content was 6%, which is not significant given the variation in nitrogen content was 10% for identically treated samples (FIG. 9).

The DHIPS-modified $SiO_2$ surface showed little variation in both nitrogen content and biopolymer interaction activity after storage in a dry box for about 7 months.

General Procedure for Preparing DNA Wrapped Carbon Nanotubes (DNA-CNTs)

Two types of carbon nanotubes (CNTs) were purchased as dry powders and evaluated. Mixed chirality single-walled CNTs from Carbon Solutions contained both metallic and semiconducting CNTs (product name AP-SWNT having an average diameter of 1.4 nm, a length range of 0.5 to 3.0 micrometers, and a ratio of semiconducting:metallic single-walled CNTs of 2:1). Semiconducting single-walled CNTs, product name IsoNanotubes-S™ (a trademark of NanoIntegris Technologies, Inc. of Boisbriand, Quebec, Canada), were obtained from NanoIntegris (having a diameter range of 1.2 nm to 1.7 nm and a length range of 300 nm to 5 micrometersa). All DNA oligonucleotides were purchased from Integrated DNA Technologies.

Example 3

DNA SEQ ID NO. 1 and 2 were used in the following procedure. DNA stock solutions of about 250 micromolar concentration were prepared by adding water to a purchased film containing the DNA of known extinction coefficient. The stock solutions were stored at −20° C. until use, and then diluted to an appropriate concentration as desired. The exact concentration of DNA stock solution was determined by the optical absorbance at 260 nm wavelength for each DNA sequence. The Beer-Lambert law was used to calculate the final concentration: $A=\log(I_o/I)=\epsilon*c*p$ where A is absorbance at 260 nm, $I_o$ and I are respectively the incident and transmitted light, c is the molar concentration of an oligonucleotide (mole/L), and p is the light path length through the sample (cm).

Prior to use, the DNA sequence 1 and 2 were hybridized to form a double stranded DNA (dsDNA) complex using the following method. The DNA sequence 1 and 2 were mixed together with the TAEMg buffer such that the final concentration of DNA sequence 1 was 33 micromoles/L and DNA sequence 2 was 36 micromoles/L in 500 microliters of 1×TAEMg. This final DNA solution was heated up to 80° C. at 1° C./minute and cooled down to 20° C. at 1° C./min to hybridize DNA sequences 1 and 2 together.

A CNT dry powder (~0.3 mg) of 90% semiconducting CNTs (NanoIntegris) was mixed with the hybridized DNA solution (~69 micromolar in 1×TAEMg buffer). 1×TAEMg buffer contains 40 mM Tris, 20 mM acetic acid, 2 mM EDTA, and 12.5 mM magnesium acetate. The resulting mixture was sonicated in a bath sonicator for about 2 hours at a bath temperature of about 5° C. The DNA-CNT colloidal dispersion was centrifuged at 16000 g for 90 minutes at 4° C. to remove CNT aggregates. After centrifugation, the supernatant containing stable DNA-CNT colloidal dispersion was collected and stored at −80° C.

Standard Protocol for Depositing DNA-CNT and DNA on DHIPS-Modified Substrates

DNA-CNT and DNA structures can be deposited on DHIPS-modified substrates using a wide range of salt concentrations as well as pH. The following procedure is representative.

A small volume of DNA-CNT dispersion (1-20 microliters) in 1×TAEMg was deposited dropwise on a 0.5 cm×0.5 cm DHIPS-modified substrate. If a DNA-CNT dispersion volume of less than 20 microliters was used, an appropriate amount of 1×TAEMg buffer was added to bring the volume to at least 20 microliters. The resulting initial DNA-CNT modified substrate was incubated for 5 minutes at room temperature. Additional 1×TAEMg buffer (80 microliters) solution was added dropwise to the initial DNA-CNT modified substrate. The resulting buffer treated DNA-CNT modified substrate was incubated for another 5 minutes at room temperature. The buffer treated DNA-CNT modified substrate was then washed by successive immersion for 5 seconds in 20%, 40%, and 60% v/v isopropyl alcohol (IPA)/water without drying between immersions. Finally, the IPA washed DNA-CNT modified substrate was then dried using compressed dry nitrogen.

Mica is known to interact strongly with DNA-CNTs but is not useful for electronic applications. In the following figures, mica serves as a reference for comparing the relative binding properties of other surfaces to a given DNA-CNT.

FIGS. 11A-11C are atomic force microscope (AFM) micrographs obtained under fluid, showing the results of treating a DHIPS-modified $SiO_2$ surface, a mica surface (comparative), and a non-modified $SiO_2$ surface (comparative), respectively, with the above-described DNA-CNT. Adsorbed DNA-CNT appears as lighter shaded filaments. DNA-CNT adsorbed strongly to the DHIPS-modified $SiO_2$ and mica, but not to the unmodified $SiO_2$.

Example 4

Preparation of DNA origami. The protocol and the DNA strands are identical to the square DNA origami used in H. Maune et al., "Self-assembly of carbon nanotubes into two-dimensional geometries using DNA origami templates," Nature Nanotechnology volume 1, pages 61-66 (2010).

Example 5

Preparation of DNA ribbon. The protocol and the DNA strands are identical to the 16-wide "000000" DNA ribbon of R. Barish et al., "An information-bearing seed for nucleating algorithmic self-assembly," PNAS volume 106, pages 6054-6059 (2009).

Example 6

Preparation of DNA 3-dimensional crystals. The protocol and the DNA strands are identical to the DNA bricks used in the following reference for a cube of 40 $nm^3$ crystal: Y. Ke et al., "DNA brick crystals with prescribed depths," Nature Chemistry, volume 6, pages 994-1002 (2014).

Figure 14A:
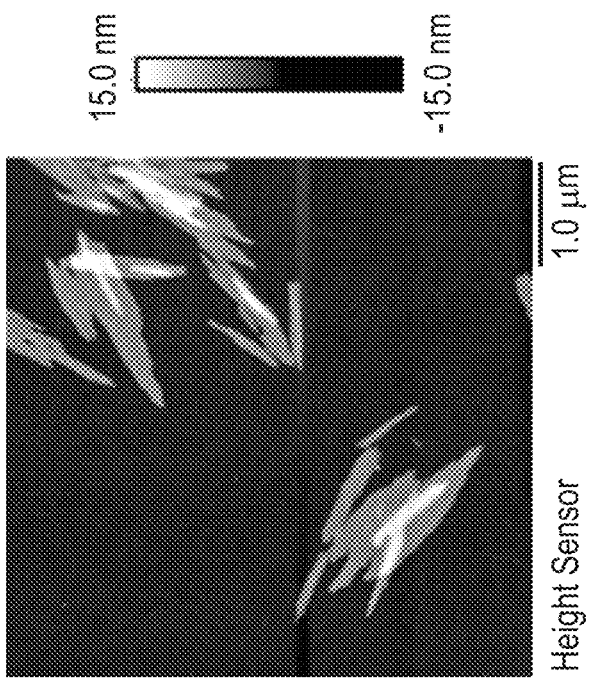
FIGS. 14A-14B (AFM micrographs) compare binding of mica and DHIPS-modified $SiO_2$, respectively, with 3-dimensional DNA crystals (500 nm×1 micrometer×30 nm) of Example 6.
Figure 14B:
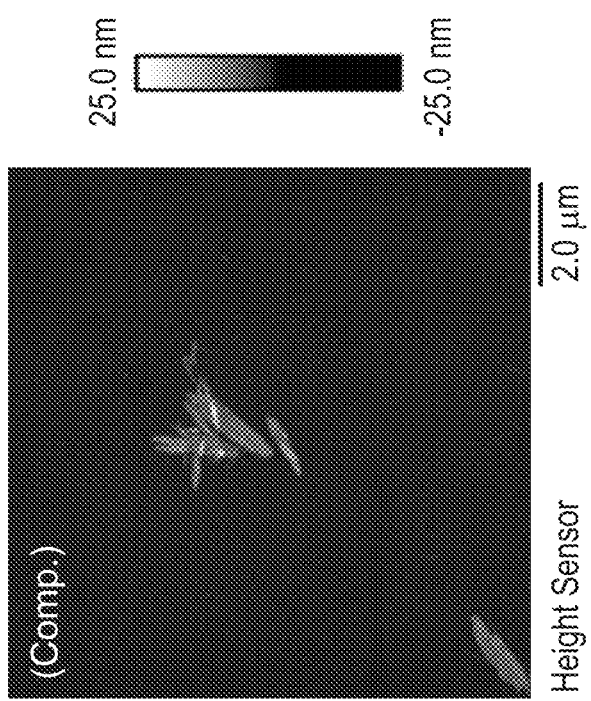

FIGS. 12A-12B (AFM micrographs) compare binding of mica and DHIPS-modified $SiO_2$, respectively, with two-dimensional DNA origami (100 nm×100 nm). FIGS. 13A-13B (AFM micrographs) compare binding of mica and DHIPS-modified $SiO_2$ surface, respectively, with two-dimensional DNA ribbons (~100 nm×1 micrometer). FIGS. 14A-14B (AFM micrographs) compare binding of mica and DHIPS-modified $SiO_2$, respectively, with three-dimensional DNA crystals (500 nm×1 micrometer×30 nm). In each case, the DNA strongly adsorbed to the mica and DHIPS-modified $SiO_2$ surfaces under physiological conditions.

Salt Solutions

The DNA-CNTs were prepared using other cationic buffers. 1×TAEMg is preferred, and its salt concentration and pH are within the range of many other physiological buffers. Three other salt solutions tested for dispersion are $MgCl_2$ (1 mM to 12 mM), NaCl (1 mM to 12 mM), and 1×TBE (89 mM Tris (pH 7.6), 89 mM boric acid, 2 mM EDTA) with 100 mM NaCl at pH 8.3.

Various salts of $Mg^{+2}$, $Ca^{+2}$, $Co^{+2}$, $Zn^{+2}$, $Na^{+1}$, $K^{+1}$ and concentrations were also evaluated for DNA-CNT deposition on DHIPS-modified substrate. $Mg^{+2}$, $Na^{+1}$, $K^{+1}$ cations all enable DNA-CNT deposition on DHIPS-modified substrates without causing DNA-CNT aggregation. The best results were obtained using $Mg^{+2}$ (~12 mM to 0.12 mM), $Na^{+1}$ (1.5 M to 0.375 M), and $K^{+1}$ (1 M to 0.12 M). Table 2 summarizes qualitative results for dications $Mg^{+2}$, $Ca^{+2}$, $Co^{+2}$ and $Zn^{+2}$ at concentration 12.5 mM, where a rank of 1=most acceptable, 2=marginally acceptable, and 3=not acceptable.

TABLE 2

| Salt | Substrate | Concentration | DNA-CNT deposition | Note | Rank |
|---|---|---|---|---|---|
| Magnesium (1X TAEMg) | DHIPS | 12.5 mM | Yes | Very little aggregation | 1 |
| Calcium ($Ca_2Cl$) | DHIPS | 12.5 mM | Yes | Lot of aggregation | 2 |
| Cobalt ($Co_2Cl$) | DHIPS | 12.5 mM | Moderate | Low concentration | 3 |
| Zinc ($Zn_2Cl$) | DHIPS | 12.5 mM | Low | Very low concentration | 3 |

Table 3 summarizes the concentration ranges of $Mg^{+2}$, $Na^+$, and $K^+$ that produced acceptable binding of DNA-CNT to a DHIPS-modified surface.

TABLE 3

| Salt | Highest concentration showing acceptable binding | Lowest concentration howing acceptable binding | Tested but showed poor binding |
|---|---|---|---|
| Mg | 1xTAEMg | 0.1xTAEMg | 0.01xTAEMg |
| NaCl | 1.5M | 0.5M | 0.375M |
| $KH_2PO_4$ | 1M | about 0.75M | 0.012M |

Comparing the lowest salt concentration to the highest salt concentration at which acceptable binding was seen, the amount of DNA-CNT and DNA bound to the substrate was significantly less (about one-tenth) for the lowest salt concentration. Increasing the incubation time to over an hour before the diluted alcohol wash increased the DNA-CNT and DNA concentration bound to the surface.

APTES-Modified Surface Used to Prepare SAMs (Comparative)

Example 7

Modification of silicon oxide surface with primary amine compound (3-aminopropyl)triethoxysilane (APTES). An APTES-modified $SiO_2$ surface was prepared using the following procedure. The silicon wafers were washed with DCE followed by IPA using a bath sonicator for 1 minute each and then dried with compressed $N_2$. The washed wafers were further plasma treated under oxygen atmosphere at 250 mTorr, 300 Watt for 1 minute. These were then placed on a hot plate at 100° C. for 1 hour under nitrogen atmosphere with an inverted 100 mL beaker forming an enclosed chamber. A solution of 1.23 mL toluene (anhydrous) with 0.175 mL APTES was prepared under nitrogen environment in a 5 mL vial and placed next to the silicon wafer on the hotplate with nitrogen flow rate of 100 mTorr for 1 hours. The wafers were cooled under the nitrogen flow to room temperature prior to removal and then stored in a dry box.

Example 8

Preparation of silicon oxide surface to form silanol groups using reactive ion etching (ME) under oxygen atmosphere. The silicon wafers were cleaned using a bath sonicator in DCE followed by IPA for one minute each and then dried with compressed nitrogen. The cleaned silicon substrates underwent RIE in a March XP 20 plasma cleaner using the top wafer platter (platter separation 2.5 cm cm) to activate the $SiO_2$. The RIE was done using 300 mTorr oxygen atmosphere at 10 watts for 20 seconds.

Figure 15:
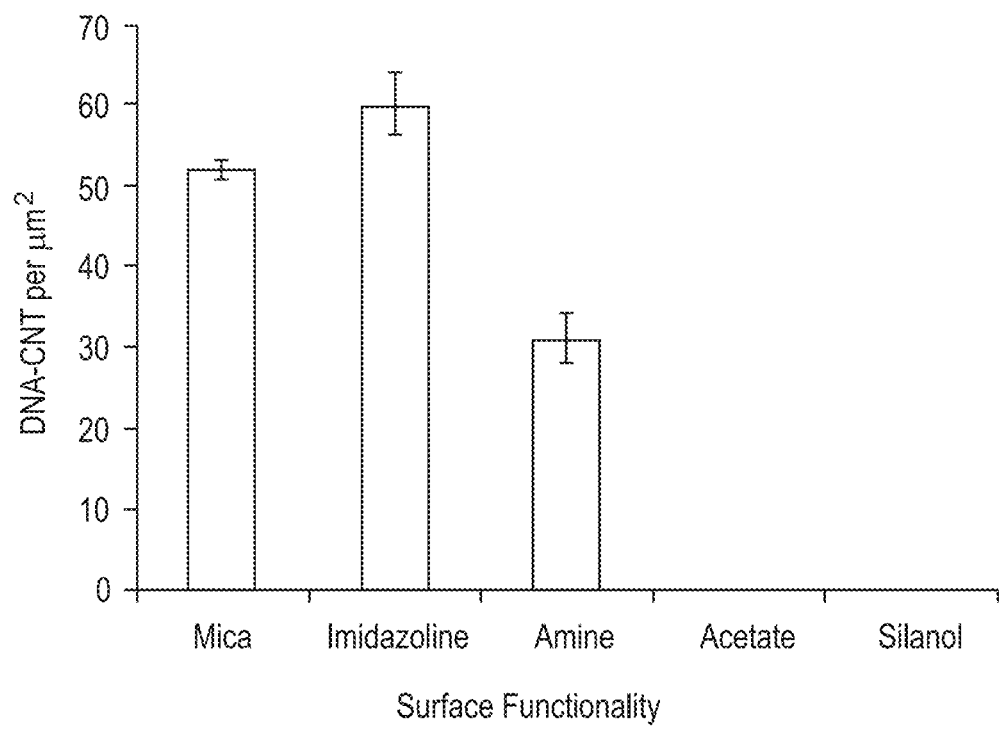
FIG. 15 (bar graph) compares the DNA-CNT concentration adsorbed per square micrometer on mica (comparative), $SiO_2$ modified with DHIPS (labeled "imidazoline), mica, $SiO_2$ modified with APTES (labeled "amine", comparative, Example 7), and RIE (reactive ion etch) treated silicon oxide (labeled "silanol", comparative, Example 8).

FIG. 15 (bar graph) compares the adsorbed DNA-CNT concentration per square micron on APTES-modified $SiO_2$ (labeled "amine") and DHIPS-modified $SiO_2$ (labeled "imidazoline), mica, and RIE treated $SiO_2$ (labeled "silanol" in the graph). The APTES-modified surface showed weak binding (30 DNA-CNT per square micrometer). The DHIPS-modified surface showed the strongest binding (60 DNA-CNT per square micrometer), followed by the mica surface (52 DNA-CNT per square micrometer). The RIE treated $SiO_2$ showed no DNA-CNT binding.

Patterning of DHIPS-Modified Oxide Substrates by Direct Ablation

Two approaches were evaluated for direct ablation of DHIPS-modified $SiO_2$ to generate a patterned SAM: i) UV assisted photo cleavage and ii) electron beam direct write ablation.

Figure 16:
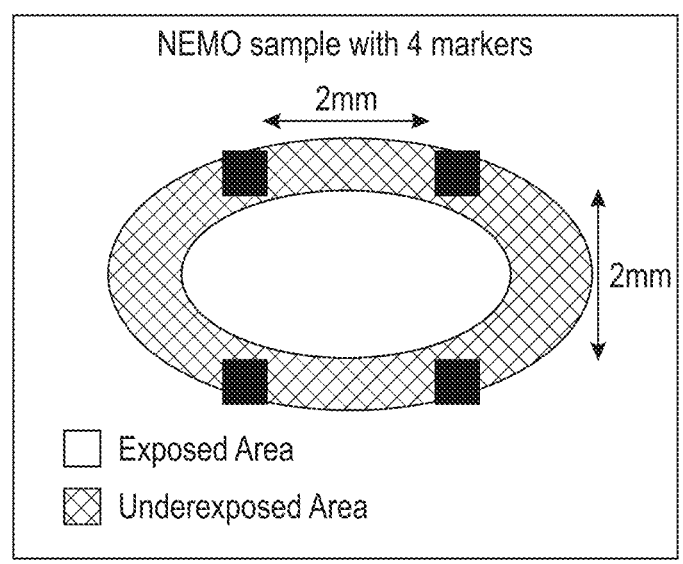
FIG. 16 is a schematic drawing of the UV exposure area of the NEMO 193 tool.

For UV assisted photocleavage, the DHIPS-modified $SiO_2$ substrates were irradiated with 193 nm UV using a homebuilt NEMO 193 nm interferometric lithography tool employing a variable prism having a focus of 0.85 nm at ambient conditions. These exposure conditions were used to generate 100 nm half pitch line-space patterns. FIG. 16 is a schematic drawing of the exposure area of the NEMO 193 tool. The exposed area (beam size of 193 nm NEMO tool is ~2 mm×2 mm) inside four metal markers. The edge of the sample is not exposed to 193 nm irradiation.

Figure 17:
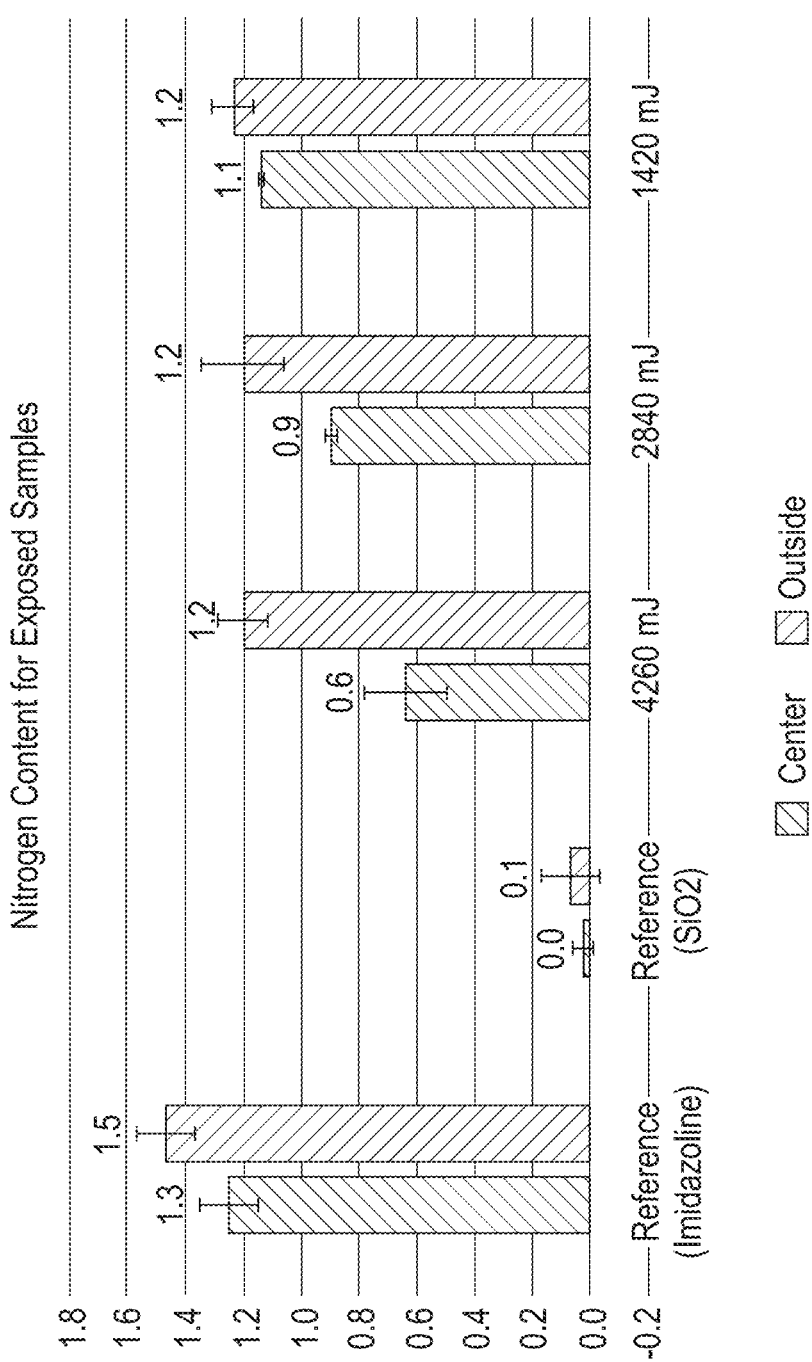
FIG. 17 is a graph showing the 193 nm dose matrix given the DHIPS-modified $SiO_2$ using the NEMO 193 tool, and the XPS nitrogen analysis of the exposed areas (labeled "center") and non-exposed areas ("outside").

FIG. 17 (graph) shows the dose matrix and XPS nitrogen analysis of the exposed (labeled "center") and non-exposed regions ("outside"). The XPS analysis shows a decrease in surface nitrogen for increasing doses of 193 nm exposure whereas it remains unchanged for unexposed areas at the edge of the sample.

DHIPS line patterns having 1:1 line-space ratio and 100 nm line width were formed using a 193 nm dose of 1420 $mJ/cm^2$, 4260 $mJ/cm^2$, and 7100 $mJ/cm^2$, respectively.

Electron beam direct write ablation was not effective in achieving selective placement of the DNA-CNT on non-written areas of the DHIPS layer.

Figure 18A:
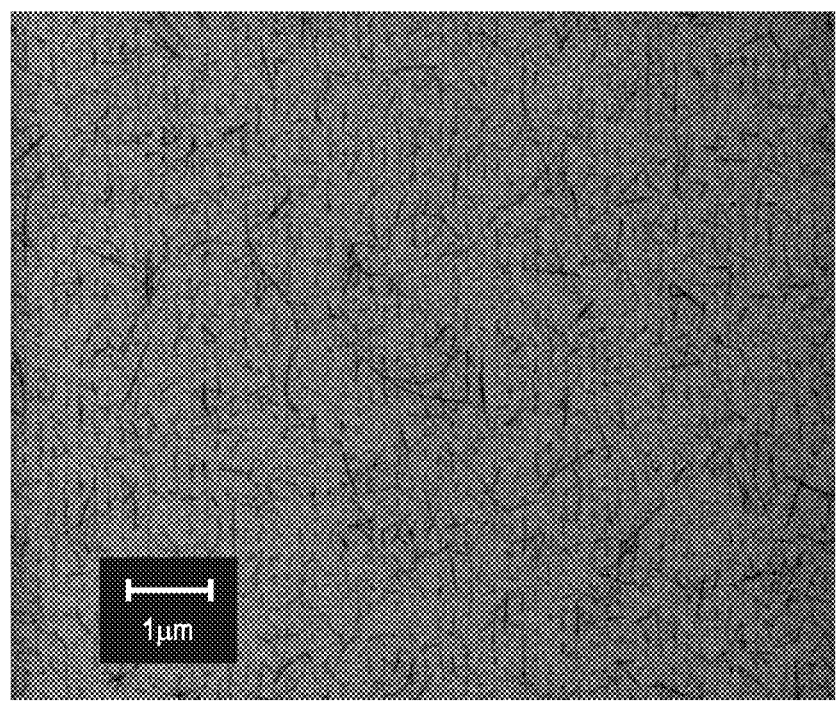
FIGS. 18A-18C are scanning electron micrographs (SEMs) comparing the DNA-CNT deposition results for line patterns formed using doses of 1420 $mJ/cm^2$, 4260 $mJ/cm^2$, and 7100 $mJ/cm^2$, respectively.
Figure 18B:
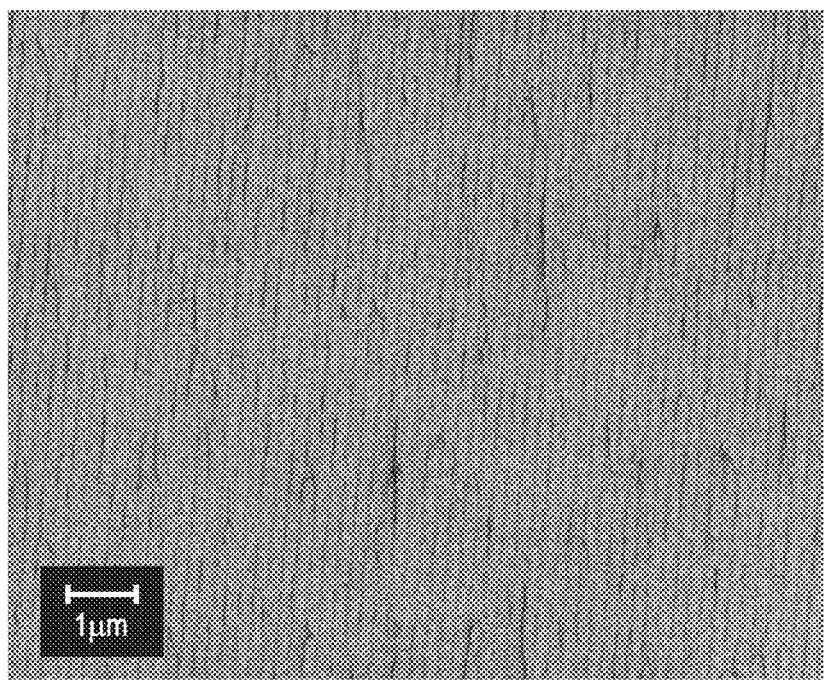
Figure 18C:
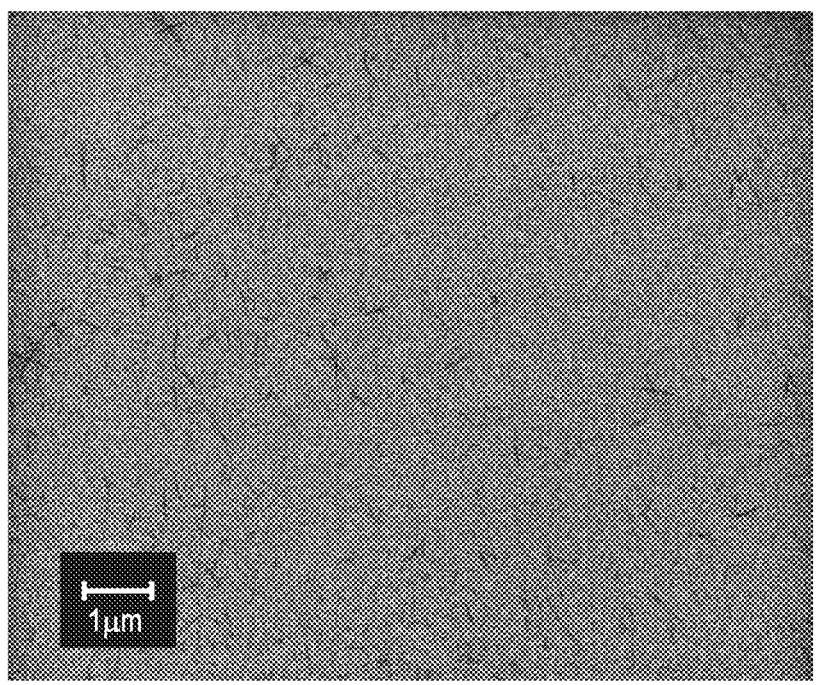

FIGS. 18A-18C are scanning electron micrographs (SEMs) comparing the DNA-CNT deposition results for 193 nm line patterns formed using doses of 1420 $mJ/cm^2$, 4260 $mJ/cm^2$, and 7100 $mJ/cm^2$, respectively. The SEM micrographs confirm the appropriate degradation of DHIPS from the "space" regions enabling selective placement of DNA-CNTs only on non-exposed DHIPS "lines" (i.e., top surfaces). The dark lines are DNA-CNTs in the SEM micrographs. Appreciable selective placement of DNA-CNT was obtained for a dose of about 4000 $mJ/cm^2$. Lowering the dose to below 2000 mJ/cm2 or increasing the dose to around 7000 mJ/cm2 decreased the selective placement of DNA-CNTs. Low doses did not provide sufficient photocleavage of the DHIPS monolayer whereas high doses likely photocleaved most of the DHIPS.

Patterning DHIPS-Modified Substrates Using a Resist

JSR-AR-2073 negative resist (NR) was used for patterning the DHIPS-modified $SiO_2$ substrates.

Using 248 nm UV lithography, the JSR-AR-2073-11 was spin-coated on a DHIPS-modified $SiO_2$ substrate at 3750 rpm to obtain a film thickness of 70 nm. The resist coated substrate was given a post-application bake (PAB) at 120° C. for 60 seconds and then was irradiated through a line-space mask using 248 nm UV at a dose of 25 mJ. The exposed substrate was given a post-exposure bake (PEB) at 110° C. for 60 seconds and then developed using anisole for 30 seconds to remove the non-exposed resist. The exposed substrates were stored under nitrogen until after the development step. The developed substrate contained line-patterns of the exposed resist disposed on the DHIPS monolayer.

For 193 nm UV lithography, JSR-7072-14 was spin-coated on a DHIPS-modified $SiO_2$ substrate at 3000 rpm to obtain a film thickness of 125 nm. The resist coated substrate was given a PAB at 120° C. for 60 seconds, and then was irradiated through a line-space mask using 193 nm UV using a variable prism (focus=1.5 mm) followed by a PEB at 110° C. at 60 seconds. The optimal dose for 100 nm half pitch was 23.8 $mJ/cm^2$, and the optimal dose for 50 nm half pitch was 19.0 $mJ/cm^2$. The exposed and baked substrate was developed with anisole for 30 seconds to remove non-exposed resist. The substrates were stored under nitrogen until after the development step. The developed patterned substrate contained line-patterns of the exposed resist disposed on the DHIPS monolayer.

For e-beam lithography, a positive tone resist, JSR AR2073-11, was used in a reversed tone "negative tone develop" mode. Specifically, the resist was spin-coated on a DHIPS-modified $SiO_2$ substrate at 3750 rpm to obtain a film thickness of 70 nm. The resist coated substrate was given a PAB at 120° C. for 60 seconds and then was irradiated directly using electron beam at a dose of 100 micro amps per square centimeter using a Raith/Vistec VB6 100 kV exposure tool. The samples were then given a PEB at 110° C. for 60 seconds. The exposed and baked substrate was developed with anisole for 25 seconds. The developed substrates were stored under nitrogen until after the development step. The developed substrate contained line-patterns comprising exposed resist disposed on the DHIPS monolayer.

All three methods of patterning DHIPS-modified substrates using a resist produced resist line patterns of similar quality. Electron beam lithography was used for producing 5-100 nm line-space patterns. 248 nm UV lithography was employed for larger line-space patterns.

Figure 19:
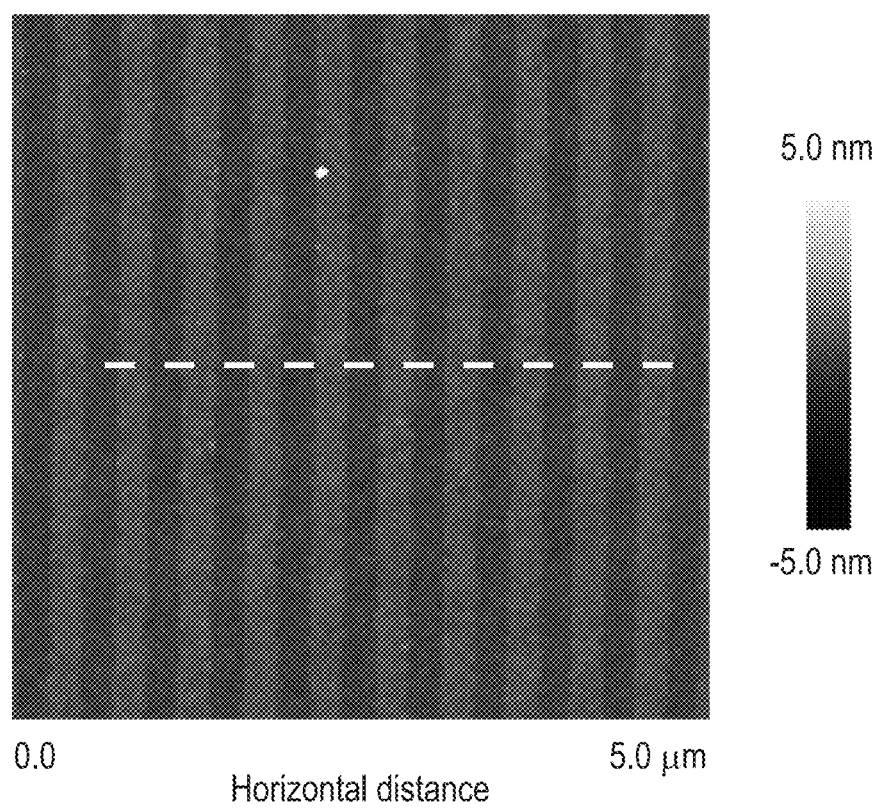
FIG. 19 is an AFM height micrograph of a DHIPS line pattern formed with DHIPS-modified $SiO_2$ after e-beam lithography and oxygen reactive ion etch (ME).
Figure 20:
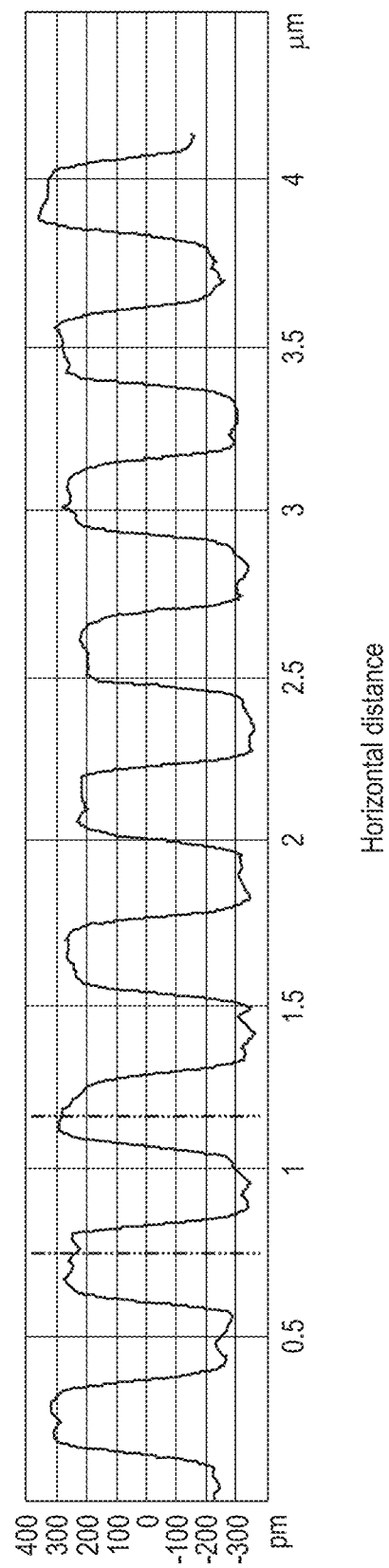
FIG. 20 is a graph of a cross-section of the AFM micrograph of FIG. 19 showing height variation of the patterned DHIPS substrate with horizontal distance.

FIG. 19 is an AFM height micrograph of a DHIPS line pattern formed with DHIPS-modified $SiO_2$ after e-beam lithography using a dose of 4260 $mJ/cm^2$ and oxygen reactive ion etch (RIE). Darker gray areas indicate where DHIPS was removed, and lighter gray areas indicate where DHIPS remains. FIG. 20 is a cross-section of the AFM micrograph of FIG. 19 showing height variation of the patterned DHIPS substrate with horizontal distance. FIG. 20 confirms uniform deposition of DHIPS was achieved and shows the monolayer to be about 0.5 nm in height (i.e., thickness).

Selective Etch of DHIPS in Developed Areas of Resist Patterned Substrates

The resist-patterned DHIPS-modified $SiO_2$ substrates were treated with oxygen reactive ion etch (RIE) in a March XP 20 plasma cleaner using the bottom wafer platter (platter separation 10 cm) to selectively remove the DHIPS in the trench areas of the resist line pattern. The RIE was done using 300 mTorr oxygen atmosphere at 10 watts for 20 seconds. The substrates were then immersed in EKC265™ stripper bath for 5 minutes to strip the resist, resulting in a patterned DIHPS layer on the $SiO_2$ of the substrate.

The above protocol was optimized to obtain the cleanest substrate (i.e., free of resist) and sufficient DHIPS degradation to inhibit binding of DNA in the trench. An RIE of 10 W to 20 W for 10-30 seconds was sufficient to achieve DHIPS degradation in the resist trenches. The step height measured by AFM of degraded DHIPS was ~0.3 nm on average. From the various resist stripping agents tested (acetone, TMAH, EKC265™) under various conditions, the most uniform line patterns were obtained with EKC265™ for selective placement of DNA-CNT and DNA structures.

Figure 21:
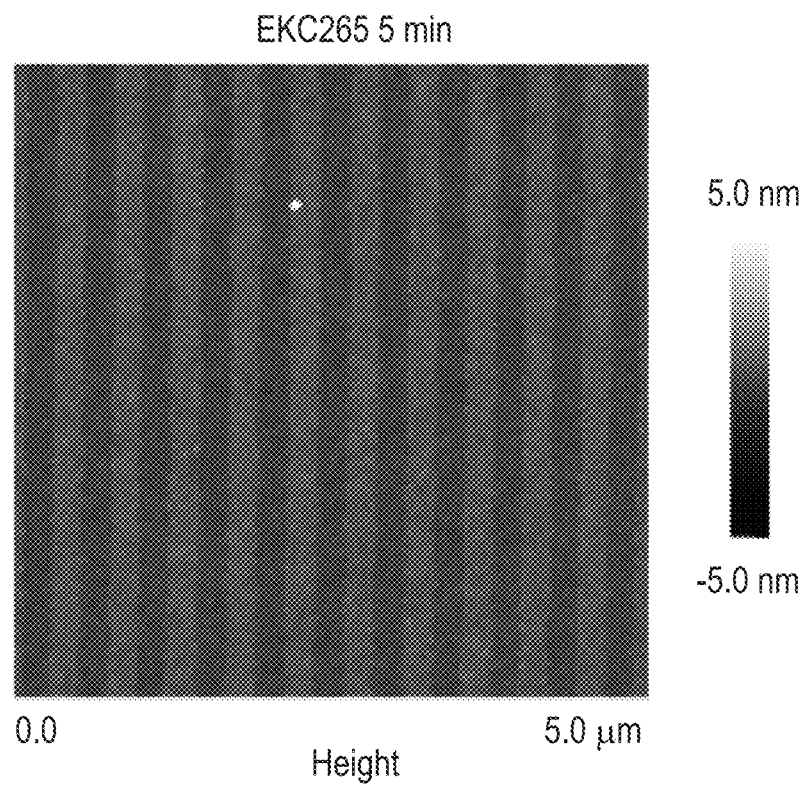
FIG. 21 is an AFM height micrograph of the etched DHIPS line pattern obtained after stripping any remaining resist for 5 minutes with EKC265™ (EKC is a trademark of Dupont Electronics, Inc., Wilmington Del.).

FIG. 21 is an AFM height micrograph of the DHIPS line pattern obtained after stripping resist 5 minutes with EKC265™.

Depositing DNA-CNT and DNA on Patterned DHIPS-Modified Substrate

A small volume of DNA-CNT dispersion in 1×TAEMg (1-16 microliters) was deposited on a 0.5 cm×0.5 cm patterned DHIPS-modified substrate. Additional 1×TAEMg was added to bring the volume to 16 microliters and further 1.5 M NaCl (4 microliters) was added for a total volume of 20 microliters. The final reaction buffer contained 0.3 M Na+ and 10 mM $Mg^{+2}$. The sample was incubated for 1 hour at room temperature under high humidity. 1×TAEMg buffer (80 microliters) was added and the sample was incubated for another 5 minutes at room temperature. The sample was then washed by successive 5 second immersions in 20%, 40%, and 60% isopropyl alcohol (IPA) in water without letting the sample dry between immersions. Finally, the sample was dried using compressed dry nitrogen.

Figure 22:
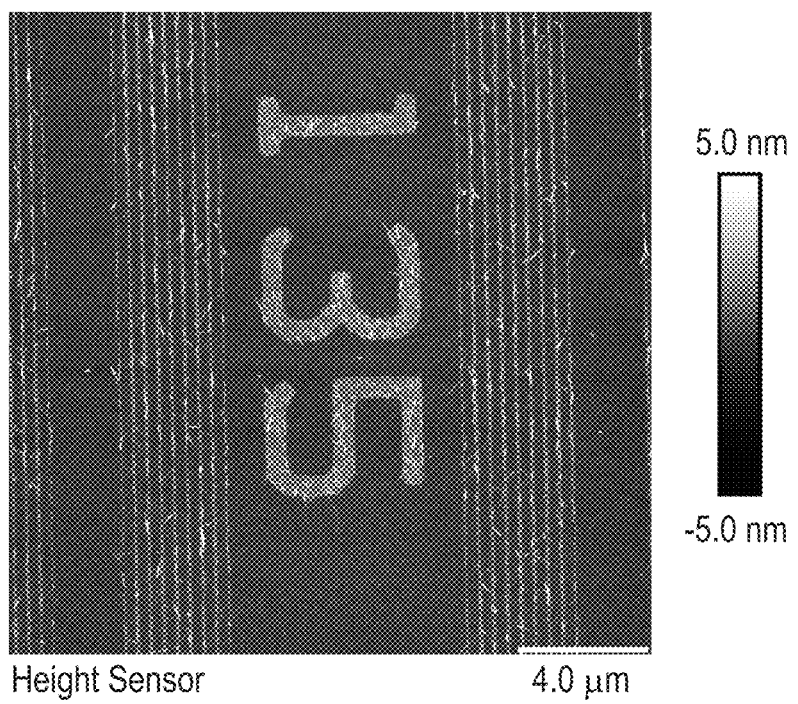
FIG. 22 is an AFM height micrograph of the DNA-CNT pattern formed on a patterned DHIPS layer using 1×TAEMg buffer. The AFM micrographs confirm that the DNA-CNTs selectively deposit on DHIPS.

FIG. 22 is an AFM height micrograph of the DNA-CNT pattern formed on a patterned DHIPS layer using 1×TAEMg buffer. The AFM micrographs confirm the DNA-CNTs selectively deposited on DHIPS.

Orientation of DNA-CNTs 50 nm, 100 nm, and 200 nm half-pitch line patterns having 1:1 or 1:2 line-space ratios were prepared using DHIPS-modified $SiO_2$. Greater than 90% selectivity (excluding aggregated DNA-CNT structures) for DNA-CNT placement onto the patterned DHIPS features was obtained when the DNA-CNT was deposited using the above-described conditions. Also, the DNA-CNT aligned within 10 degrees of the long axis of the DHIPS features (1:2 line-space ratio, 50 nm half pitch pattern) with about 60% efficiency when deposited using the above-described conditions.

DNA-CNT Field Effect Transistor (FET) Fabrication and Testing

To test the effect of DHIPS on a CNT FET device performance, e-beam lithography was used to fabricate CNT FET devices, and these devices were compared with CNT FET devices fabricated on unmodified $SiO_2$.

A 200-nm thick poly(methyl methacrylate) (PMMA) layer was spin-coated onto a non-patterned DNA-CNT layer (formed as described above on a non-patterned DHIPS-modified $SiO_2$) and a fine electrical contact pattern was e-beam written using a Leica e-beam VB6 HR tool. The pattern was developed in a 1:3 mixture of methyl isobutyl ketone (MIBK) and IPA and then dried with compressed nitrogen. To remove any residual DNA prior to metal deposition, the sample was dipped in DNA ExitusPlus™ ) solution for 15 seconds, rinsed in de-ionized (DI) water, dipped for 2 seconds in HCl, rinsed again in DI water, and finally dried with nitrogen. A stacking metal film comprising 1-nm thick titanium, 20-nm thick palladium, and 20-nm thick gold was deposited using thermal evaporation on a homebuilt evaporator. Lift-off of PMMA was performed at room temperature in acetone without sonication followed by an IPA rinse. The sample was then dried with nitrogen.

For large electrical contact pads connecting to the fine electrical contacts, a 450-nm thick PMMA layer was spin-coated on the sample. A proximity corrected contact pad pattern was exposed using the Leica e-beam VB6 HR tool with a current of 5 nA and dose depending on the area within the pattern. The contact pad pattern was developed in a 1:3 mixture of MIBK and IPA then dried with compressed nitrogen. A stacking metal film of 5-nm thick titanium and 50-nm thick gold was deposited using thermal evaporation on a homebuilt evaporator. Lift-off of the PMMA was performed at room temperature in acetone without sonication followed by an IPA rinse and the sample was dried with nitrogen.

Figure 23:
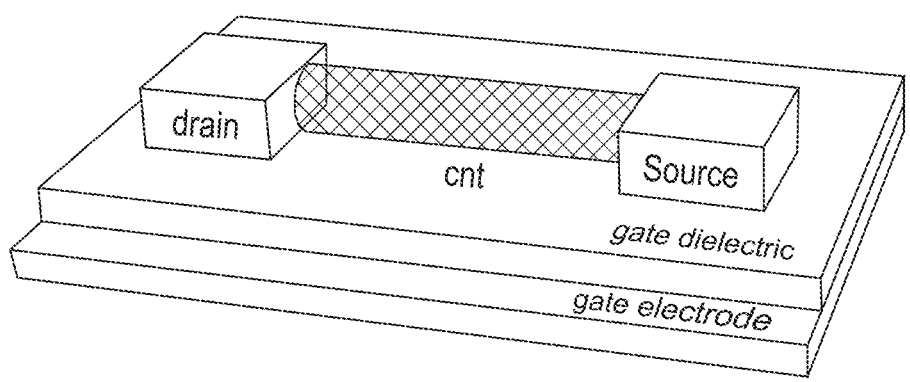
FIG. 23 is a schematic drawing of a carbon nanotube field effect transistor (CNT FET) showing the source and drain connected by the CNT.
Figure 24:
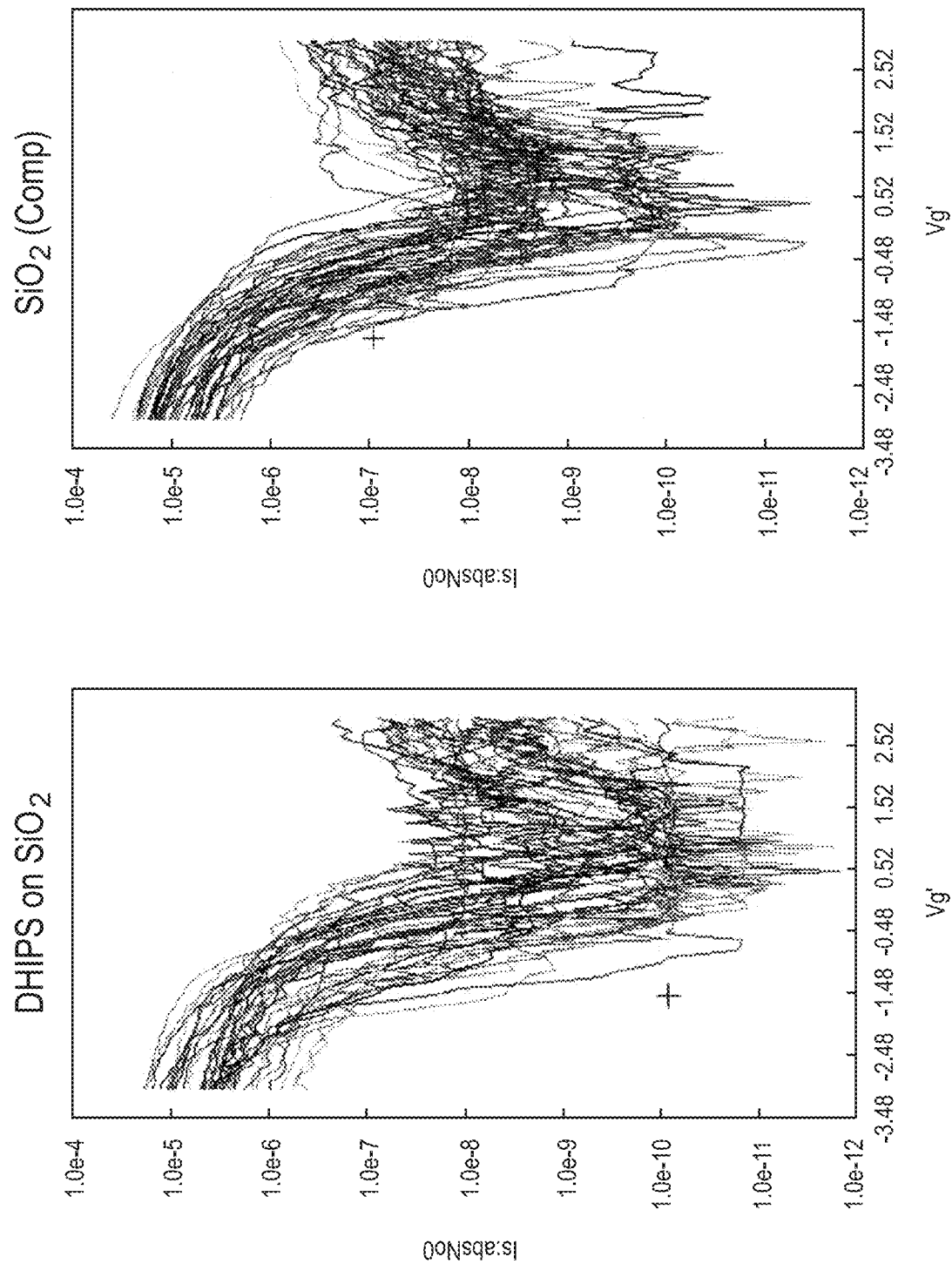
FIGS. 24A-24B are graphs comparing performance of the CNT FET prepared on DHIPS-modified $SiO_2$ and a CNT FET prepared on pristine $SiO_2$ (comparative), respectively.

The electrical measurements on the constructed CNT FETs were performed at room temperature. The transfer (Id-Vg) and output (Id-Vd) curves of CNT transistor arrays were measured at room temperature on a Cascade Microtech Summit 12000 semi-automated probe station connected to an Agilent B1500A Semiconductor Device Analyzer. The CNT-FET devices on DHIPS-modified substrates had an ON/OFF ratio and a subthreshold slope similar to FET devices formed using a non-modified substrate. FIG. 23 is a schematic drawing of a CNT FET showing the source and drain connected by the CNT. FIGS. 24A-24B are graphs comparing performance of the CNT FET prepared on DHIPS-modified $SiO_2$ and a CNT FET prepared on pristine $SiO_2$ (comparative), respectively.

Derivatization of Hafnium Oxide Substrates with DHIPS

Figure 25:
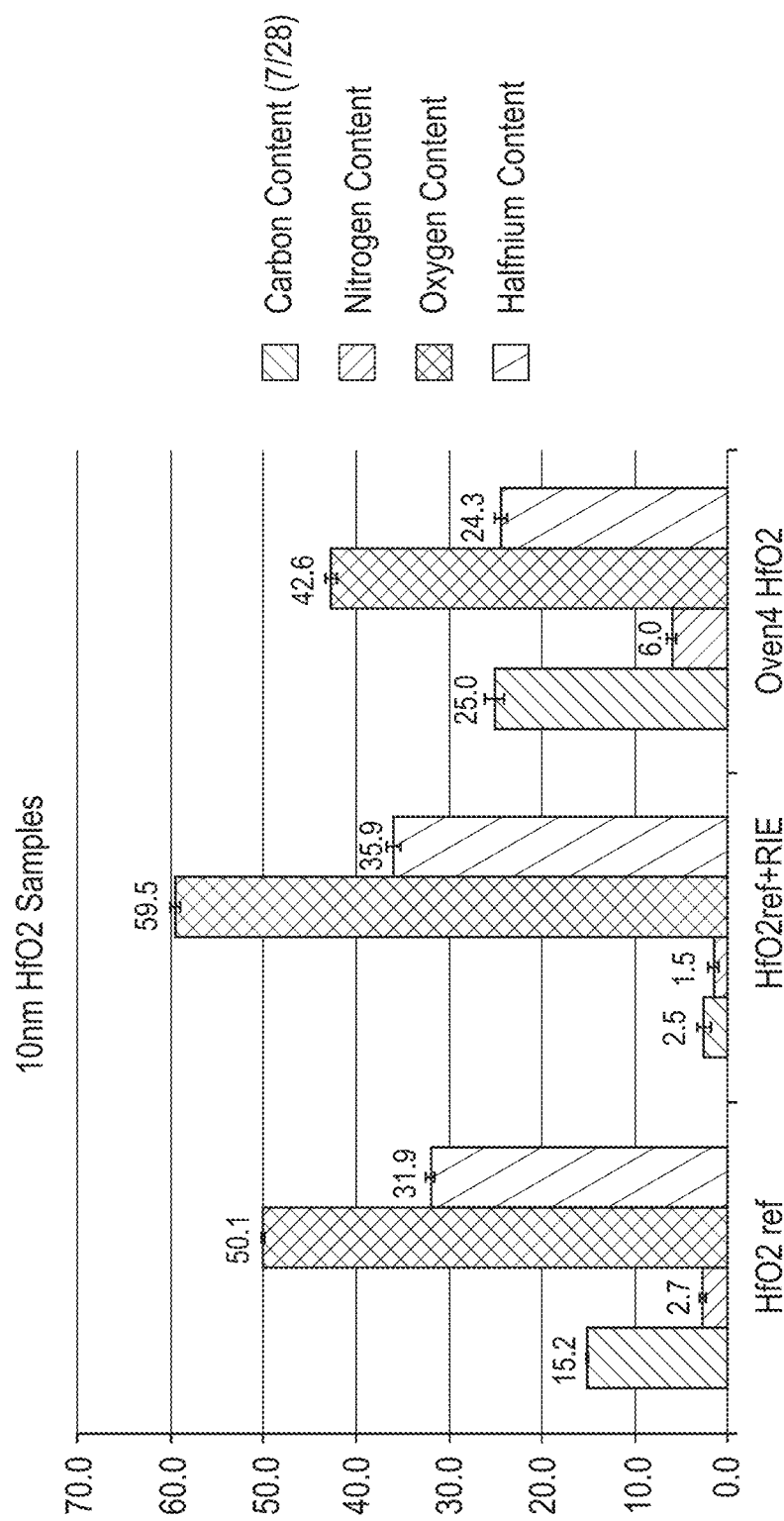
FIG. 25 is a bar graph comparing the XPS analysis of a $HfO_2$ surface before and after plasma treatment and DHIPS treatment.
Figure 26A:
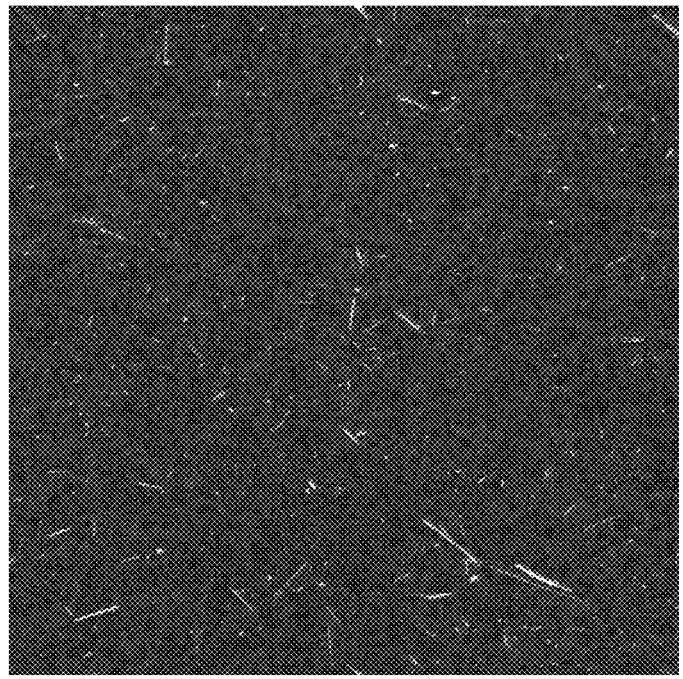
FIGS. 26A-26B are AFM micrographs qualitatively comparing the amount of DNA-CNT (bright filaments) bound to non-modified $HfO_2$ and DHIPS-modified $HfO_2$, respectively. The DHIPS-modified surface has a higher concentration of bound DNA-CNT.
Figure 26B:
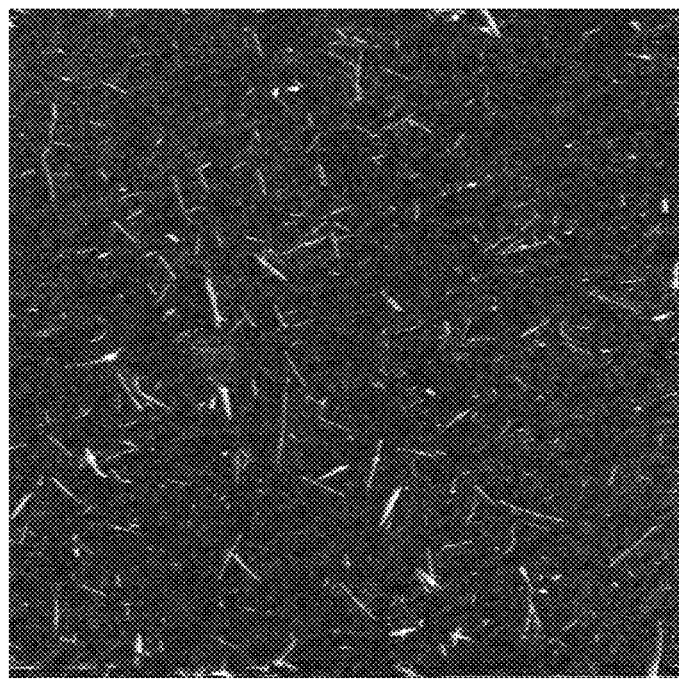

Hafnium wafers were oxygen plasma treated as described further above. DHIPS modification of the resulting $HfO_2$ surface (basic metal oxide with high dielectric constant) was optimized for the conventional silylation oven using the general procedure of Example 2. FIG. 25 is a bar graph comparing the XPS analysis of the $HfO_2$ surface before and after plasma treatment and DHIPS treatment. Surface nitrogen and carbon increased with DHIPS treatment whereas oxygen and hafnium decreased, indicating successful attachment of the DHIPS to the hafnium oxide surface. In this instance, Si(IV)-O—Hf(IV) bonds were formed binding the DHIPS layer to the plasma treated metal oxide layer. The DHIPS-modified $HfO_2$ surface binds strongly with the DNA-CNT of Example 3. FIGS. 26A-26B are AFM micrographs qualitatively comparing the amount of DNA-CNT (bright filaments) bound to non-modified $HfO_2$ and DHIPS-modified $HfO_2$, respectively. The DHIPS-modified surface has a higher concentration of bound DNA-CNT.

SUMMARY

Methods of forming patterned biopolymer layers optionally comprising carbon nanotubes have been prepared using 2-dimensional and 3-dimensional DNA structures. When employing a resist, the reactive ion etch (RIE) conditions were optimized to allow clean stripping of the resist while selectively removing/degrading regions of the DHIPS monolayer, resulting in selective binding of DNA-CNT to the remaining DHIPS regions. As an example, using the lower wafer platter (10 cm plate spacing), and an oxygen plasma setting of 10 Watts for 20 seconds, the nitrogen content of the DHIPS layer was reduced by a third in the RIE exposed areas. For these RIE conditions, EKC265 stripping solvent cleanly removed residual resist for subsequent DNA-CNT and DNA binding to the remaining DHIPS layer. Greater than 90% selectivity (excluding DNA-CNT aggregated structures) for DNA-CNT binding to DHIPS surfaces was achieved when the DNA-CNT was deposited as described. Moreover, using a DHIPS pattern of 0.5 nm thickness, the DNA-CNT aligned within 10 degrees to the 1:2 line-space, 50 nm half pitch pattern with over 60% efficiency when deposited as described. The present invention offers aqueous dispersion of CNT, simpler processing with fewer steps, stable chemical patterning over long time scale, while achieving over 90% selectivity and 60% orientation control for 50 nm half pitch lines using only chemical patterning.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method, comprising:
providing a substrate comprising a top surface, the top surface comprising an oxide of silicon(IV) and/or hafnium(IV);
disposing a compound comprising i) a nitrogen heterocycle and ii) a silicon(IV) group and/or a hafnium(IV) group onto the top surface, thereby forming a crosslinked self-assembled monolayer (SAM) covalently linked to the top surface, the SAM having a thickness of about one molecule of the compound, the SAM having a top surface comprising the nitrogen heterocycle, the SAM crosslinked by divalent oxygen groups linking silicon (IV) and/or hafnium (IV) groups of the SAM;
exposing the SAM pattern-wise to ultraviolet light and/or an electron beam, thereby forming a patterned SAM disposed on the substrate, the patterned SAM comprising chemically distinct exposed regions and non-exposed regions; and
disposing an aqueous mixture onto the patterned SAM, the aqueous mixture comprising a complex, the complex comprising a biopolymer, a metal cation, and a carbon nanotube bound together by non-covalent interactions, thereby forming a layered structure comprising a patterned biopolymer layer, the patterned biopolymer layer comprising one or more biopolymer features separated by recessed regions, the one or more biopolymer features substantially confined to, and non-covalently bound to, respective top surfaces of non-exposed regions of the patterned SAM by the metal cation;

wherein
- the biopolymer is non-covalently bound to nitrogen heterocycle surface groups of the SAM,
- the carbon nanotube of the complex is wrapped by one or more strands of the biopolymer, and
- each of the one or more biopolymer features comprises one or more molecules of the biopolymer, one or more ions of the metal cation, and one or more molecules of the carbon nanotube, and
- the exposed regions of the patterned SAM have none of, or substantially none of, the complex disposed thereon.

2. The method of claim 1, wherein the top surface of the substrate comprises silicon oxide and silicon(IV)-OH groups.

3. The method of claim 1, wherein the top surface of the substrate comprises hafnium oxide and hafnium(IV)-OH groups.

4. The method of claim 1, wherein the biopolymer is selected from the group consisting deoxyribonucleic acids, ribonucleic acids, and proteins.

5. The method of claim 4, wherein the biopolymer is a deoxyribonucleic acid.

6. The method of claim 1, wherein the metal cation is selected from the group consisting of $Na^{+1}$, $K^{+1}$, $Mg^{+2}$, $Ca^{+2}$, $Co^{30\ 2}$, and $Zn^{+2}$.

7. The method of claim 1, wherein the metal cation is $Mg^{+2}$.

8. The method of claim 1, wherein the nitrogen heterocycle is a five-membered ring comprising 2 nitrogens.

9. The method of claim 1, wherein said exposing the SAM pattern-wise to ultraviolet light and/or an electron beam ablates the SAM of the exposed regions.

10. The method of claim 1, wherein said exposing the SAM pattern-wise to ultraviolet light and/or an electron beam chemically alters the exposed regions of the SAM, lowering chemical affinity of the exposed regions of the SAM for the biopolymer.

11. The method of claim 1, wherein the compound has a structure in accordance with formula (2):

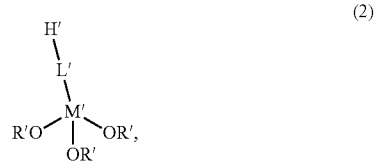

wherein
- H' is a monovalent radical comprising a nitrogen heterocycle,
- L' is any suitable divalent linking group comprising 1-20 carbons, and
- M' is silicon(IV) or hafnium(IV), and
- each R' is an independent C1-C6 hydrocarbon group.

12. The method of claim 11, wherein H' comprises 1 to 5 nitrogens.

13. The method of claim 11, wherein H' comprises a dihydroimidazole.

14. The method of claim 1, wherein the compound is N-(3-triethoxysilylpropyl)-4,5-dihydroimidazole (DHIPS).

15. The method of claim 1, wherein said disposing a compound is performed by chemical vapor deposition.

16. The method of claim 1, wherein the carbon nanotube is a conductive carbon nanotube.

17. The method of claim 1, wherein the biopolymer features are suitable for forming a field effect transistor.

18. The method of claim 1, wherein the metal ion enables biopolymer deposition on the SAM without causing biopolymer aggregation.

* * * * *

```
SEQUENCE LISTING

<160> NUMBER OF SEQ ID NOS: 2

<210> SEQ ID NO 1
<211> LENGTH: 60
<212> TYPE: DNA
<213> ORGANISM: Artificial sequence
<220> FEATURE:
<223> OTHER INFORMATION: Synthesized by DNA Technologies

<400> SEQUENCE: 1
tttttttttt tttttttttt tttttttttt tttttttttt gttgcgaggt cttgccgaca      60

<210> SEQ ID NO 2
<211> LENGTH: 27
<212> TYPE: DNA
<213> ORGANISM: Artificial sequence
<220> FEATURE:
<223> OTHER INFORMATION: Synthesized by Integrated DNA Technologies

<400> SEQUENCE: 2
ttttcgttgt cggcaagacc tcgcaac                                         27
```